(12) United States Patent
Inokuchi et al.

(10) Patent No.: US 9,177,882 B2
(45) Date of Patent: Nov. 3, 2015

(54) SEMICONDUCTOR INTEGRATED CIRCUIT DEVICE, ELECTRONIC APPARATUS, AND DISPLAY APPARATUS

(71) Applicant: ROHM CO., LTD., Kyoto (JP)

(72) Inventors: Hiroyuki Inokuchi, Kyoto (JP); Ken Hashimoto, Kyoto (JP); Tomoya Sakai, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/072,253

(22) Filed: Nov. 5, 2013

(65) Prior Publication Data

US 2014/0217426 A1 Aug. 7, 2014

(30) Foreign Application Priority Data

Nov. 5, 2012 (JP) .................. 2012-243296

(51) Int. Cl.
| | |
|---|---|
| H01L 23/12 | (2006.01) |
| H01L 23/13 | (2006.01) |
| H01L 23/00 | (2006.01) |
| H01L 25/16 | (2006.01) |
| H01L 23/498 | (2006.01) |
| H01L 23/50 | (2006.01) |
| H01L 29/417 | (2006.01) |
| H01L 29/66 | (2006.01) |
| H01L 27/12 | (2006.01) |
| H01L 21/765 | (2006.01) |

(52) U.S. Cl.
CPC .............. *H01L 23/12* (2013.01); *H01L 21/765* (2013.01); *H01L 23/4985* (2013.01); *H01L 23/49838* (2013.01); *H01L 23/50* (2013.01); *H01L 27/1203* (2013.01); *H01L 29/41725* (2013.01); *H01L 29/66659* (2013.01); *H01L 24/13* (2013.01); *H01L 24/16* (2013.01); *H01L 2224/13111* (2013.01); *H01L 2224/13144* (2013.01); *H01L 2224/16227* (2013.01); *H01L 2924/12041* (2013.01); *H01L 2924/1301* (2013.01); *H01L 2924/1305* (2013.01); *H01L 2924/1306* (2013.01); *H01L 2924/13033* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| | | | | | |
|---|---|---|---|---|---|
| 5,585,666 | A | * | 12/1996 | Imamura | 257/668 |
| 5,963,779 | A | * | 10/1999 | Leigh et al. | 438/11 |
| 6,037,957 | A | * | 3/2000 | Grande et al. | 347/147 |
| 6,388,339 | B1 | * | 5/2002 | Yamamoto et al. | 257/787 |
| 6,541,839 | B1 | * | 4/2003 | Giffard | 257/504 |
| 2008/0297676 | A1 | * | 12/2008 | Kimura | 349/39 |

FOREIGN PATENT DOCUMENTS

JP 2008-166460 A 7/2008

* cited by examiner

*Primary Examiner* — Johannes P Mondt
(74) *Attorney, Agent, or Firm* — Cantor Colburn LLP

(57) ABSTRACT

A semiconductor integrated circuit device includes a COF substrate; a semiconductor integrated circuit mounted on the COF substrate and having a first voltage circuit portion operating at a first voltage range and a second voltage circuit portion operating at a second voltage range higher than the first voltage range, the circuit portions being formed on a single chip; and a resin layer for sealing the COF substrate and the semiconductor integrated circuit.

10 Claims, 28 Drawing Sheets

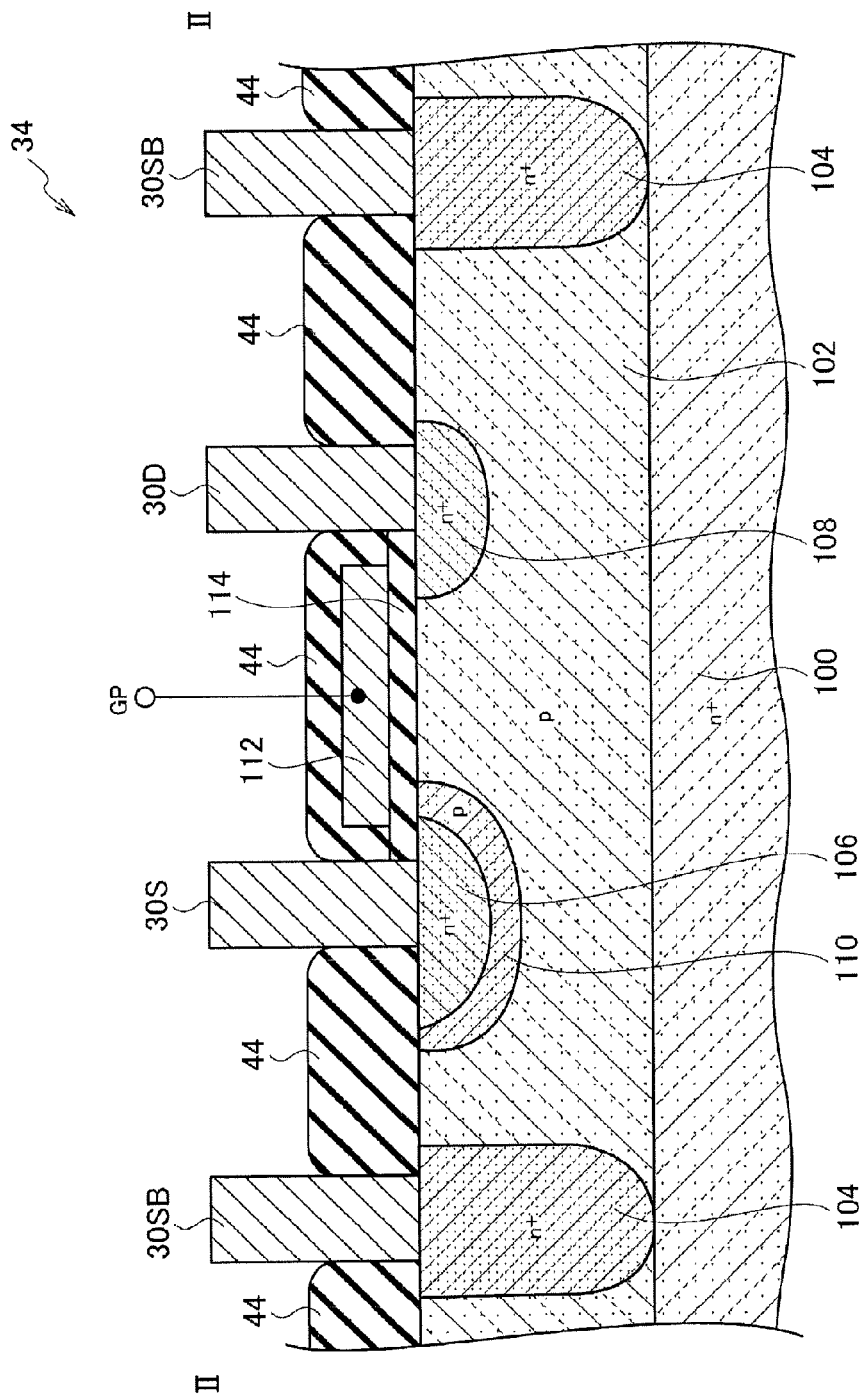

SEMICONDUCTOR INTEGRATED CIRCUIT DEVICE, ELECTRONIC APPARATUS, AND DISPLAY APPARATUS

CROSS-REFERENCE TO RELATED APPLICATION

This application is based upon and claims the benefit of priority from Japanese Patent Application No. 2012-243296, filed on Nov. 5, 2012, the entire contents of which are incorporated herein by reference.

TECHNICAL FIELD

The present disclosure relates to a semiconductor integrated circuit device, an electronic apparatus and a display apparatus. More particularly, the present disclosure relates to a semiconductor integrated circuit device having a COF (Chip On Film) structure, an electronic apparatus and a display apparatus using the same.

BACKGROUND

As a liquid crystal driving module utilized to drive a conventional thin film transistor (TFT) type liquid crystal display apparatus, a configuration exists where semiconductor integrated circuits, such as a source driver circuit, a timing controller, a power supply circuit, a light emitting diode (LED) driver circuit and so on, are individually mounted on a printed circuit board.

On the other hand, liquid crystal driving modules sealing semiconductor integrated circuits, such as a source driver circuit and so on, in a package of a COF structure using a film-like flexible substrate have also been developed.

However, such liquid crystal driving modules where semiconductor integrated circuits are individually mounted on the printed circuit board have many components, resulting in low mounting efficiency and increased costs.

SUMMARY

The present disclosure provides various embodiments of a COF-structured semiconductor integrated circuit device having low and high voltage circuit portions formed on a single chip, which is capable of improving mounting efficiency and dissipating heat from the high voltage circuit portion efficiently, and includes an electronic apparatus and a display apparatus using the same.

According to one embodiment of the present disclosure, there is provided a semiconductor integrated circuit device including: a COF substrate; a semiconductor integrated circuit mounted on the COF substrate and including a first voltage circuit portion operating at a first voltage range and a second voltage circuit portion operating at a second voltage range higher than the first voltage range, with the circuit portions formed on a single chip; and a resin layer for sealing the COF substrate and the semiconductor integrated circuit.

According to another embodiment of the present disclosure, there is provided an electronic apparatus including the above semiconductor integrated circuit device.

According to another embodiment of the present disclosure, there is provided a display apparatus including: the above semiconductor integrated circuit device; and a display unit connected to the semiconductor integrated circuit device.

BRIEF DESCRIPTION OF THE DRAWINGS

FIG. 16 is a schematic sectional view taken along line II-II in FIG. 15.

DETAILED DESCRIPTION

Figure 1:
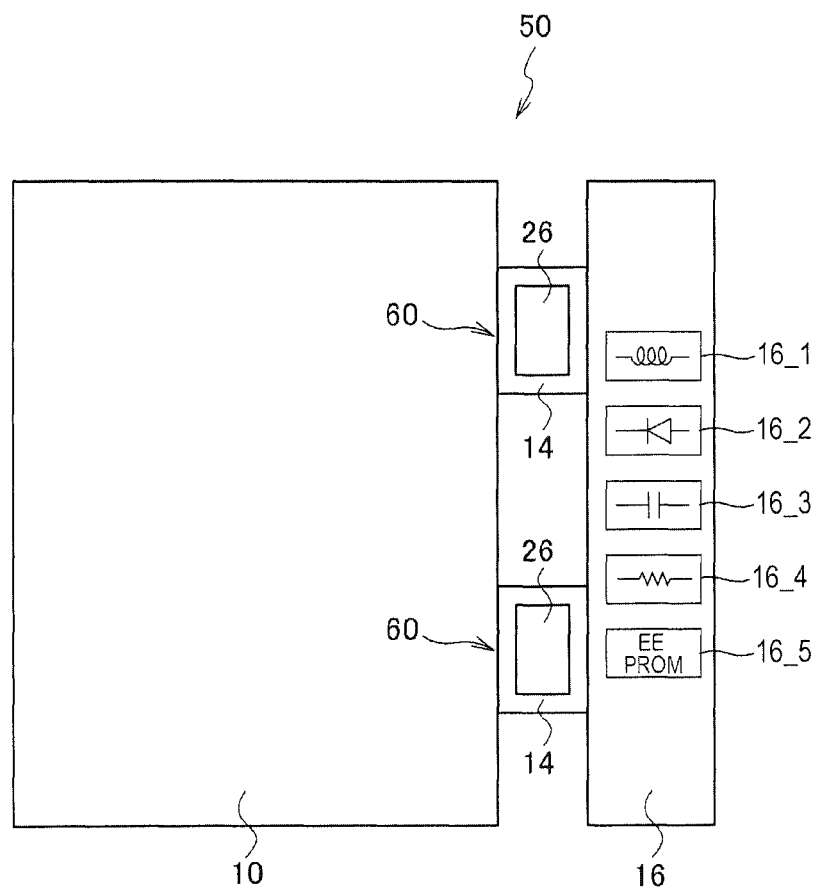
FIG. 1 is a schematic view showing a planar pattern configuration of a display apparatus according to an embodiment.

Embodiments of the present disclosure will now be described in detail with reference to the drawings. Throughout the drawings, the same or similar elements are denoted by the same or similar reference numerals. It is however noted that the relationships between thickness and planar dimension of elements, thickness ratios of various layers and so on are for illustration purposes, and may vary in actual implementation. Accordingly, detailed thickness and dimensions should be determined in consideration of the following description. In addition, it is to be understood that the figures anticipate different dimensional relationships and ratios.

The following embodiments are provided to illustrate devices and methods to embody the technical ideas of the present disclosure and are not limited to materials, forms, structures, arrangements and so on of elements detailed herein. The embodiments of the present disclosure may be modified in different ways without departing from the spirit and scope of the invention defined in the claims.

EMBODIMENTS (Display Apparatus)

FIG. 1 is a schematic view showing a planar pattern configuration of a display apparatus 50 according to an embodiment. As shown in FIG. 1, the display apparatus 50 according to this embodiment includes a display unit 10, a COF (Chip On Film) substrate 14 connected to the display unit 10 and mounted thereon with a semiconductor integrated circuit 26, and a PCB (Printed Circuit Board) 16 connected to the COF substrate 14 and mounted thereon with various discrete components (16_1, 16_2, 16_3, 16_4, and 16_5). The display unit 10 may be implemented with, for example, an LCD (Liquid Crystal Display) panel.

The semiconductor integrated circuit 26 is mounted on the COF substrate 14 and forms a semiconductor integrated circuit device 60 according to the embodiment.

The semiconductor integrated circuit device 60 according to the embodiment includes the COF substrate 14, the semiconductor integrated circuit 26 mounted on the COF substrate 14 and including a low voltage circuit portion operating at a low voltage and a high voltage circuit portion operating at a high voltage higher than the low voltage, with the circuit portions formed on a single chip, and a resin layer (not shown) for sealing the COF substrate 14 and the semiconductor integrated circuit 26. A detailed structure of the semiconductor integrated circuit device 60 will be described later.

Since the semiconductor integrated circuit device 60 according to the embodiment can effectively emit heat generated by a plurality of power semiconductor devices having a large current conduction capability in the high voltage circuit portion to an external circuit board (the PCB board 16 or the like) in low thermal impedance, the semiconductor integrated circuit device 60 can be mounted in a COF structure.

COMPARATIVE EXAMPLES

A liquid crystal driving module requires a measure against heat dissipation since a power semiconductor device having, for example, a double-diffused insulating gate field effect transistor (DMOS: Double-Diffused Metal-Oxide Semiconductor) structure is used as a power supply circuit and an LED driver circuit, and the power semiconductor device generates heat when a liquid crystal display is driven.

In particular, a liquid crystal driving module having a COF structure tends to increase the amount of generated heat and requires efficient heat dissipation since it has an increasing integration of semiconductor integrated circuits.

However, the COF structure requires a different measure against heat dissipation since it cannot mount a heat dissipating device such as a heat sink or the like.

Figure 2:
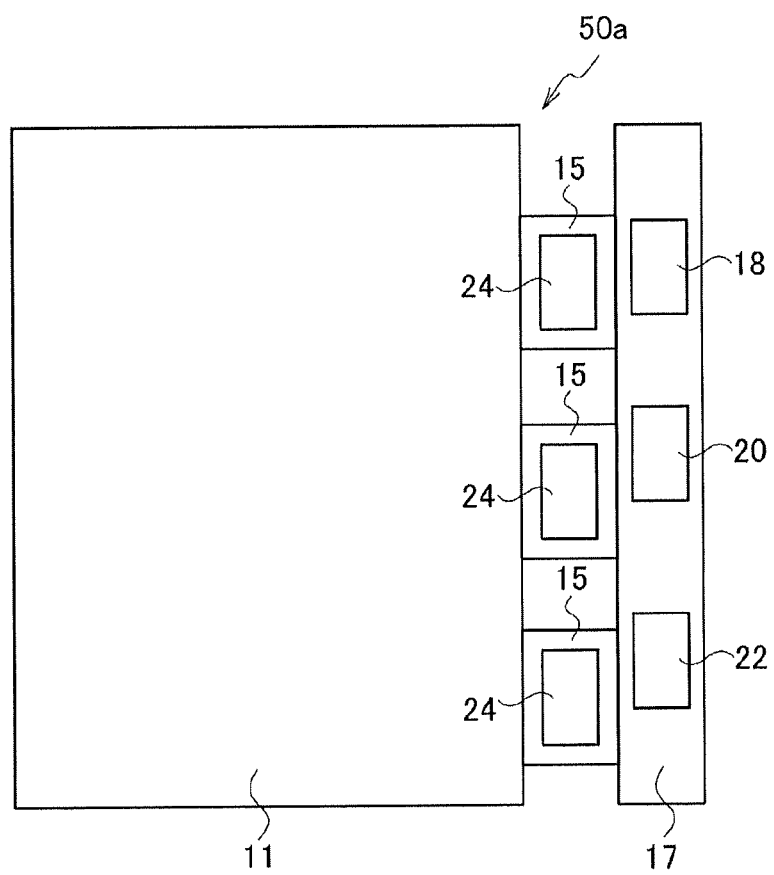
FIG. 2 is a schematic view showing a planar pattern configuration of a display apparatus according to a Comparative Example 1.

FIG. 2 is a schematic view showing a planar pattern configuration of a display apparatus 50a according to a Comparative Example 1. As shown in FIG. 2, the display apparatus 50a according to Comparative Example 1 includes a display unit 11; a COF substrate 15 connected to the display unit 11 and mounted thereon with a source driver 24; and a PCB board 17 connected to the COF substrate 15 and mounted thereon various discrete components (not shown), an LED driver 18, a power management IC 20 and a timing controller 22.

When the display apparatus 50a according to Comparative Example 1 is driven, heat is generated from the source driver 24 and the various components mounted on the PCB board 17.

Heat corresponding to about 400 mV is generated from three packages of source drivers 24 mounted on the COF substrate 15 and heat corresponding to about 500 mV is generated from the LED driver 18. Heat corresponding to about 50 mV is generated from the power management IC 20 and heat corresponding to about 50 mV is generated from the timing controller 22. Such heat has an effect on an image on the display apparatus 50a, and thus may disturb the image. Therefore, the display apparatus 50a according to Comparative Example 1 adopts a measure against heat dissipation, such as a heat sink-attached package or a back metal package, for the LED driver 18, the power management IC 20 and the timing controller 22 mounted on the PCB board 17.

On the other hand, the COF substrate 15 cannot adopt a measure against heat dissipation, such as a heat sink-attached package or a back metal package, when the source driver 24 is mounted on the COF substrate 15, and thus its element temperature tends to be increased.

Further, from the standpoint of reduction in set costs, reduction in the total number of components, easy mounting and so on, it is expected that the source driver 24, the LED driver 18, the power management IC 20, the timing controller 22 and so on are formed on a single chip and mounted on the COF substrate 15. In this case, heat from various components may be concentrated on the single chip. For example, the amount of generated heat on the chip may amount to about 990 mW.

Figure 3:
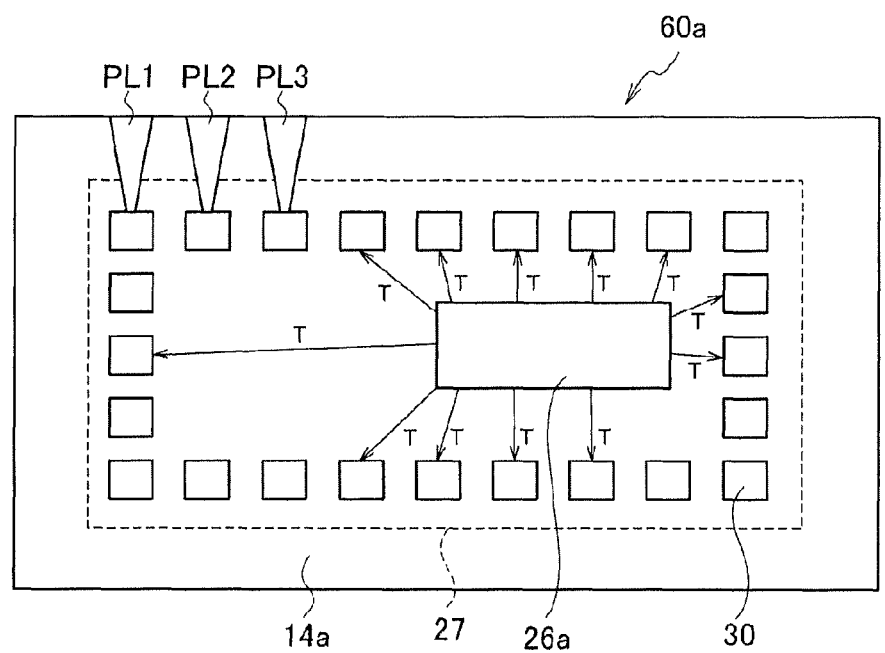
FIG. 3 is a schematic view showing a planar pattern configuration where an integrated circuit is mounted on a COF substrate and where bumps are arranged in the periphery of the integrated circuit in a semiconductor integrated circuit device display apparatus according to Comparative Example 2.

FIG. 3 is a schematic view showing a planar pattern configuration of a semiconductor integrated circuit device 60a according to a Comparative Example 2. As shown in FIG. 3, the semiconductor integrated circuit device 60a according to Comparative Example 2 includes a COF substrate 14a, a semiconductor integrated circuit 26a mounted on the COF substrate 14a, and conductive bumps (or pads) 30 arranged around the semiconductor integrated circuit 26a.

In the semiconductor integrated circuit device 60a according to Comparative Example 2, the bumps 30 are arranged around the semiconductor integrated circuit 26a so as to facilitate wiring for the semiconductor integrated circuit 26a mounted on the COF substrate 14a. Reference numerals PL1, PL2 and PL3 denote examples of COF wirings for power line. Since the bumps 30 are arranged around the semiconductor integrated circuit 26a, dissipation paths T of heat generated in the semiconductor integrated circuit 26a depend on a distance between the bumps 30 and the semiconductor integrated circuit 26a, as shown in FIG. 3.

In the semiconductor integrated circuit device 60a according to Comparative Example 2, since there is a distance between the semiconductor integrated circuit 26a corresponding to a heat generating area and the bumps 30, the amount of heat dissipated from the bumps 30 into the COF wirings PL1, PL2 and PL3 is small. More heat is introduced into the COF substrate 14a inside a bump region 27, which results in increase in temperature.

Figure 4:
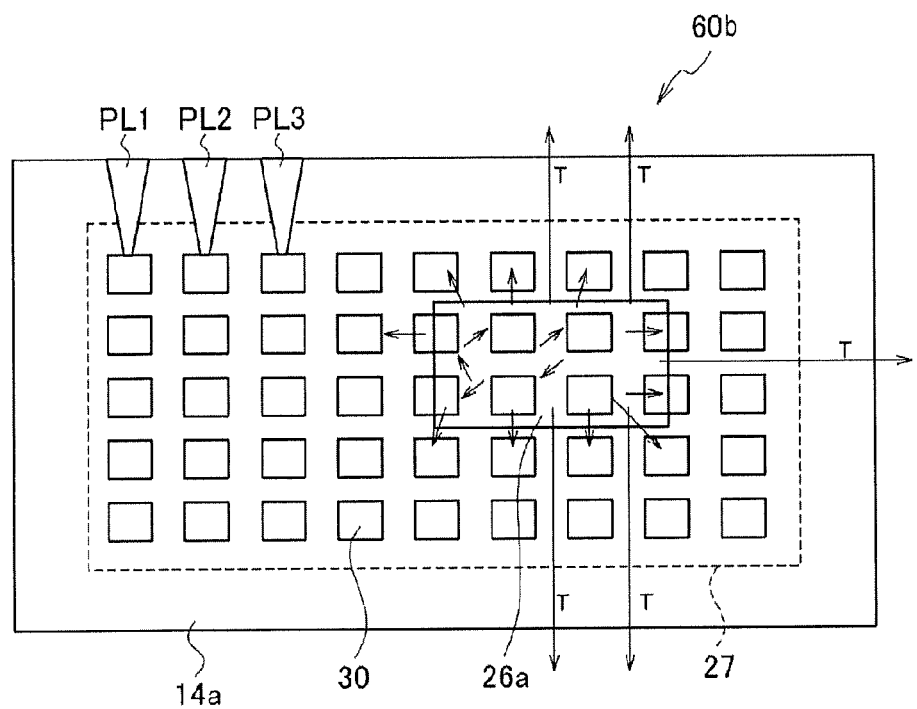
FIG. 4 is a schematic view showing a planar pattern configuration where an integrated circuit is mounted on a COF substrate and bumps are arranged on a rear surface of the COF substrate in a semiconductor integrated circuit device display apparatus according to a Comparative Example 3.

FIG. 4 is a schematic view showing a planar pattern configuration of a semiconductor integrated circuit device 60b according to Comparative Example 3. As shown in FIG. 4, the semiconductor integrated circuit device 60b according to a Comparative Example 3 includes a COF substrate 14a, a semiconductor integrated circuit 26a mounted on the COF substrate 14a, and many bumps 30 arranged on the rear surface of the COF substrate 14a.

In the semiconductor integrated circuit device 60b according to Comparative Example 3, the bumps 30 are arranged on the rear surface of the COF substrate 14a to dissipate heat from the semiconductor integrated circuit 26a.

In the semiconductor integrated circuit device 60b according to Comparative Example 3, since bumps 30 are also arranged on the COF substrate 14a in the central portion of the inside of a bump region 27, heat can be efficiently conducted in a portion where a heat source of the semiconductor integrated circuit 26a overlaps with COF wiring. That is, COF wirings such as power supply wiring, ground wiring, substrate wiring and the like may be connected to the bumps 30 mounted on the COF substrate 14a in the central portion and thus, if the COF wirings are respectively connected to terminals of a drain, source and substrate of a power semiconductor device in the semiconductor integrated circuit device 60b, heat can be efficiently conducted. However, COF wirings not connected to the terminals of the power semiconductor device have difficulty in dissipating heat. In addition, in portions where the heat source of the semiconductor integrated circuit 26a does not overlap with the COF wirings, temperature is increased since heat introduced into the COF substrate 14a in the inside of the bump region 27, like in Comparative Example 2.

(PCB Board)

Figure 5:
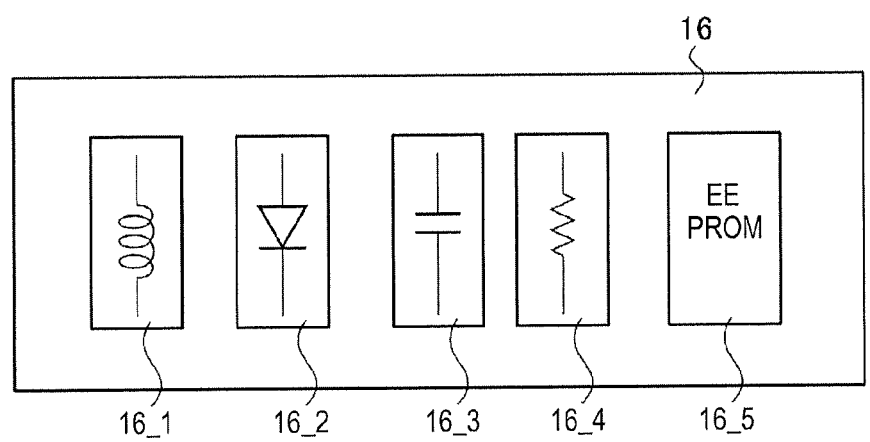
FIG. 5 is a schematic view showing a planar pattern configuration of elements such as an inductor, a diode, a capacitor, a resistor, an EEPROM and the like mounted on a PCB board in a display apparatus according to an embodiment.

FIG. 5 is a schematic view showing a planar pattern configuration of elements mounted on the PCB board 16 in the display apparatus 50 according to the embodiment. In FIG. 5, blocks of an inductor, diode, capacitor, resistor and EEPROM mounted on the PCB board 16 are denoted by reference numerals 16_1, 16_2, 16_3, 16_4 and 16_5, respectively. Thus, in the display apparatus 50 according to the embodiment, the PCB board 16 can become more compact than the PCB board 17 of Comparative Example 1 (FIG. 2) since the PCB board 16 mounts only discrete components. More specifically, in one example, four inductors 16_1, six diodes 16_2, sixty capacitors 16_3, twenty resistors 16_4 and two EEPROMs 16_5 may be mounted on the PCB board 16.

(Power Semiconductor Device)

Figure 6:
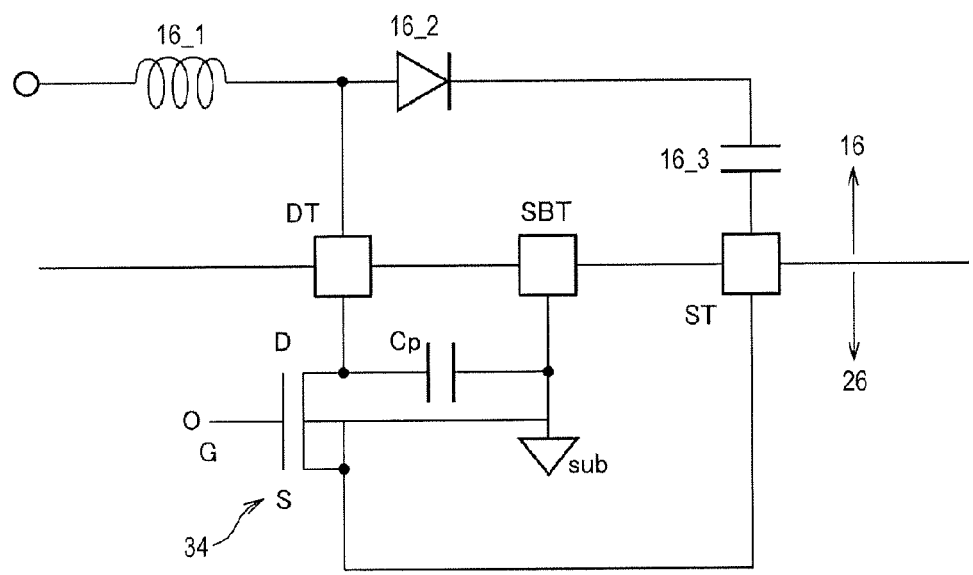
FIG. 6 shows an example of a circuit diagram where a circuit having an inductor L, a diode D and a capacitor C mounted on a PCB board is connected to a DMOSFET mounted on a semiconductor integrated circuit device according to an embodiment in a display apparatus according to an embodiment.

FIG. 6 shows an example of a circuit diagram where the inductor 16_1, diode 16_2 and capacitor 16_3 mounted on the PCB board 16 are connected to a DMOSFET 34 mounted on the semiconductor integrated circuit 26.

In the DMOSFET 34 mounted on the semiconductor integrated circuit 26, a current related to heat generation may be conduction current $I_{DS}$ conducted between a drain D and a source S of the DMOSFET 34 and a capacitive current conducted via a parasitic capacitance $C_p$ formed between the drain D and a substrate sub. Thus, in the DMOSFET 34, a heat source is present in the drain D, source S and substrate sub. On the circuit configuration, a heat source is present in a drain terminal electrode DT, a source terminal electrode ST and a substrate terminal electrode SBT.

Figure 7:
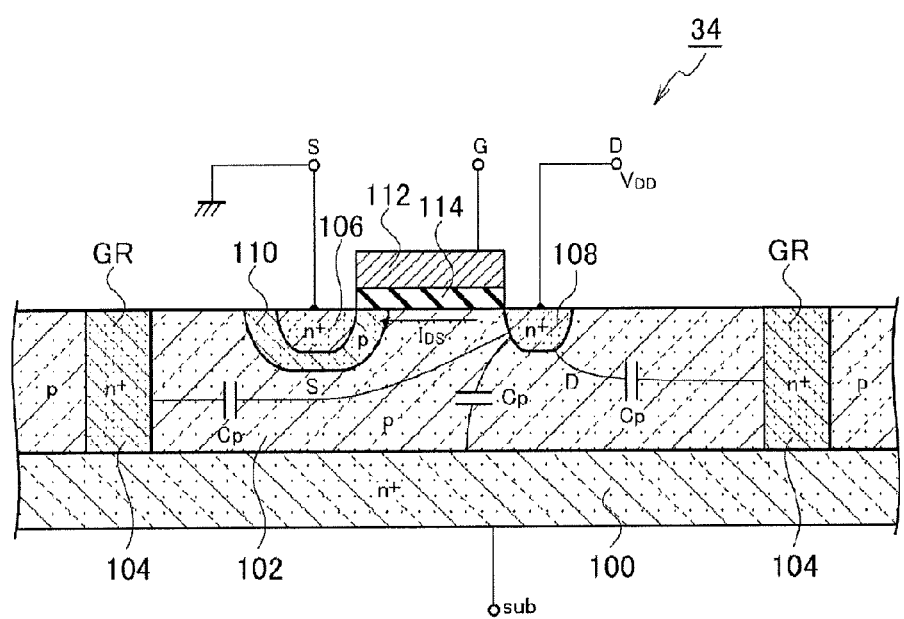
FIG. 7 is a schematic sectional view of a DMOSFET that can be utilized in a semiconductor integrated circuit device according to an embodiment.

FIG. 7 is a schematic sectional view of the DMOSFET 34. The DMOSFET 34 shown in FIG. 7 can be used as power semiconductor device, which can be utilized in the semiconductor integrated circuit device 60 to drive the display apparatus 50 according to the embodiment.

As shown in FIG. 7, the DMOSFET 34 capable of being utilized in the semiconductor integrated circuit device 60 to drive the display apparatus 50 according to the embodiment may include a p-well region 102 formed on an n+ substrate 100 by p-well diffusion, a p-type base region 110 formed in the p-well region 102 by p-type diffusion, an n+ source region 106 formed in the p-type base region 110 by n+ diffusion, an n+ drain region 108 formed in the p-well region 102 by n+ diffusion, a gate insulating film 114 formed on the p-well region 102 between the n+ source region 106 and the n+ drain region 108, and a gate electrode 112 formed on the gate insulating film 114.

As shown in FIG. 7, the DMOSFET 34 further includes a guard ring region (GR) 104, which is formed in the p-well region 102 by n+ diffusion and surrounds the DMOSFET 34.

The n+ source region 106, the n+ drain region 108 and the gate electrode 112 are connected to a source terminal S, a drain terminal D and a gate terminal G, respectively. The n+ substrate 100 is connected with a substrate terminal sub. Since the n+ substrate 100 is connected with the guard ring region (GR) 104 formed by the n+ diffusion, the guard ring region (GR) 104 has the same potential as the n+ substrate 100. Thus, by forming an electrode for the guard ring region (GR) 104 from a device surface, the guard ring region (GR) 104 can have the same potential as the substrate terminal electrode SBT (see FIG. 6). Similarly, the source terminal S has the same potential as the source terminal electrode ST and the drain terminal D has the same potential as the drain terminal electrode DT.

In the semiconductor integrated circuit device 60 according to the embodiment, although heat cannot be dissipated from the n+ substrate 100 since the semiconductor integrated circuit 26 of the power semiconductor transistor is mounted on the COF substrate 14, heat can also be dissipated from the substrate terminal electrode SBT, in addition to the source terminal electrode ST and the drain terminal electrode DT, since the substrate terminal electrode SBT is connected to the guard ring region (GR) 104 of the power semiconductor device. That is, micro bumps 30 are arranged on the source terminal electrode ST, the drain terminal electrode DT and the substrate terminal electrode SBT, respectively, and heat can be externally dissipated via COF wirings connected to the micro bumps 30. This configuration is also applicable to an nMOSFET, a pMOSFET and a CMOSFET which may constitute a power semiconductor device.

Figure 8:
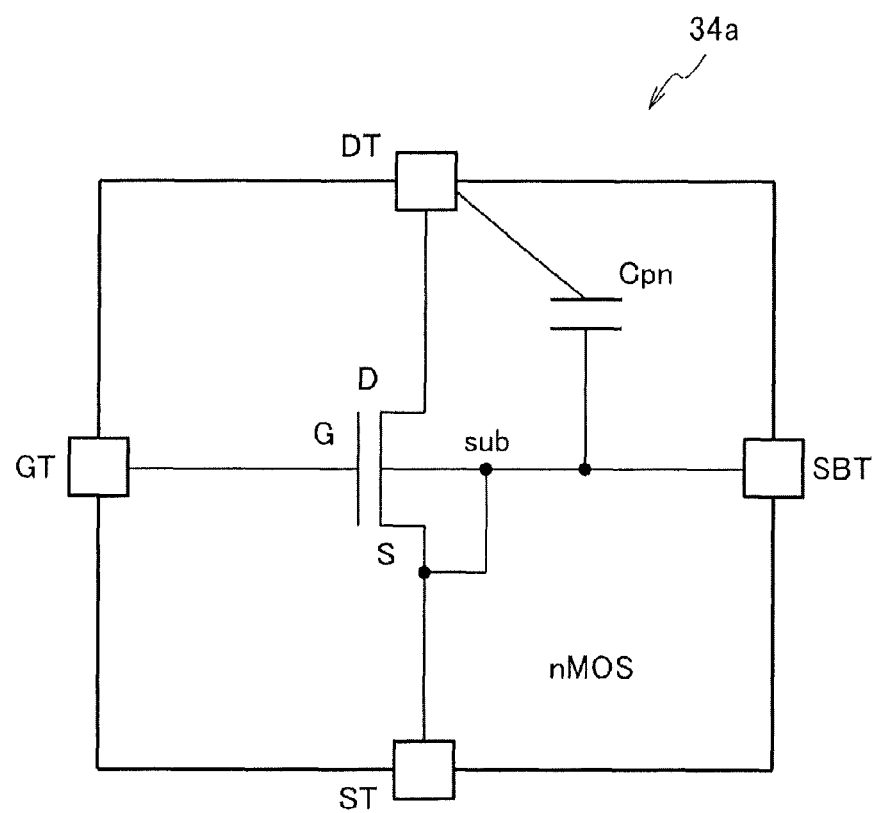
FIG. 8 is a view showing an example of a circuit diagram of an nMOSFET that can be utilized in a semiconductor integrated circuit device according to an embodiment.
Figure 9:
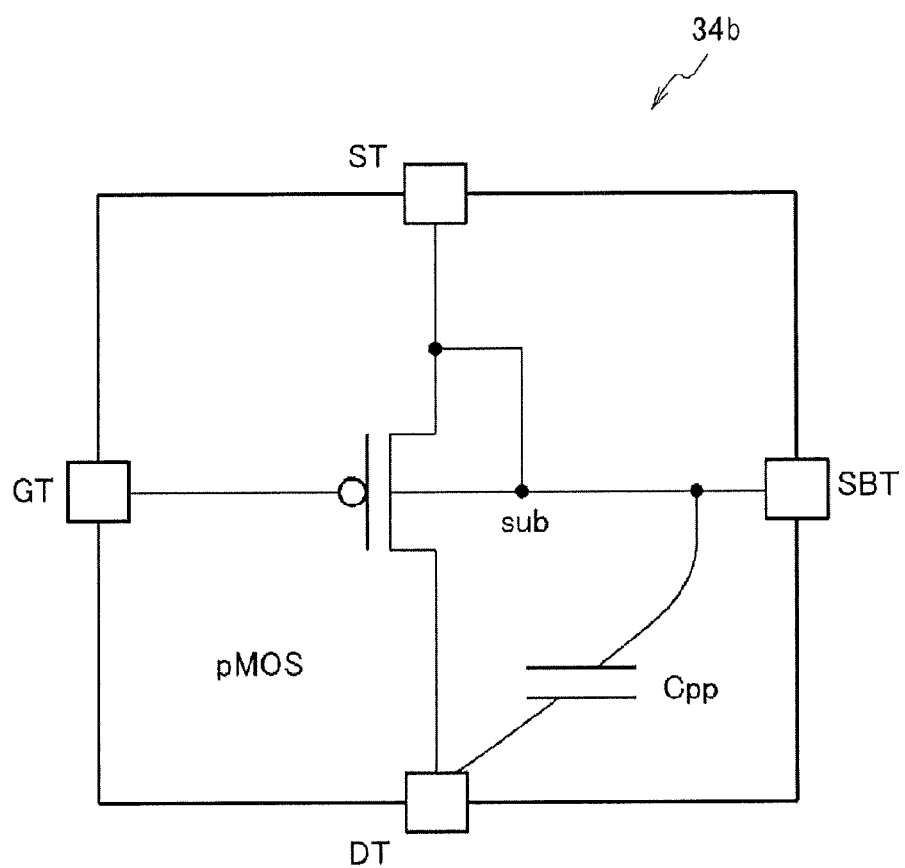
FIG. 9 is a view showing an example of a circuit diagram of a pMOSFET that can be utilized in a semiconductor integrated circuit device according to an embodiment.
Figure 10:
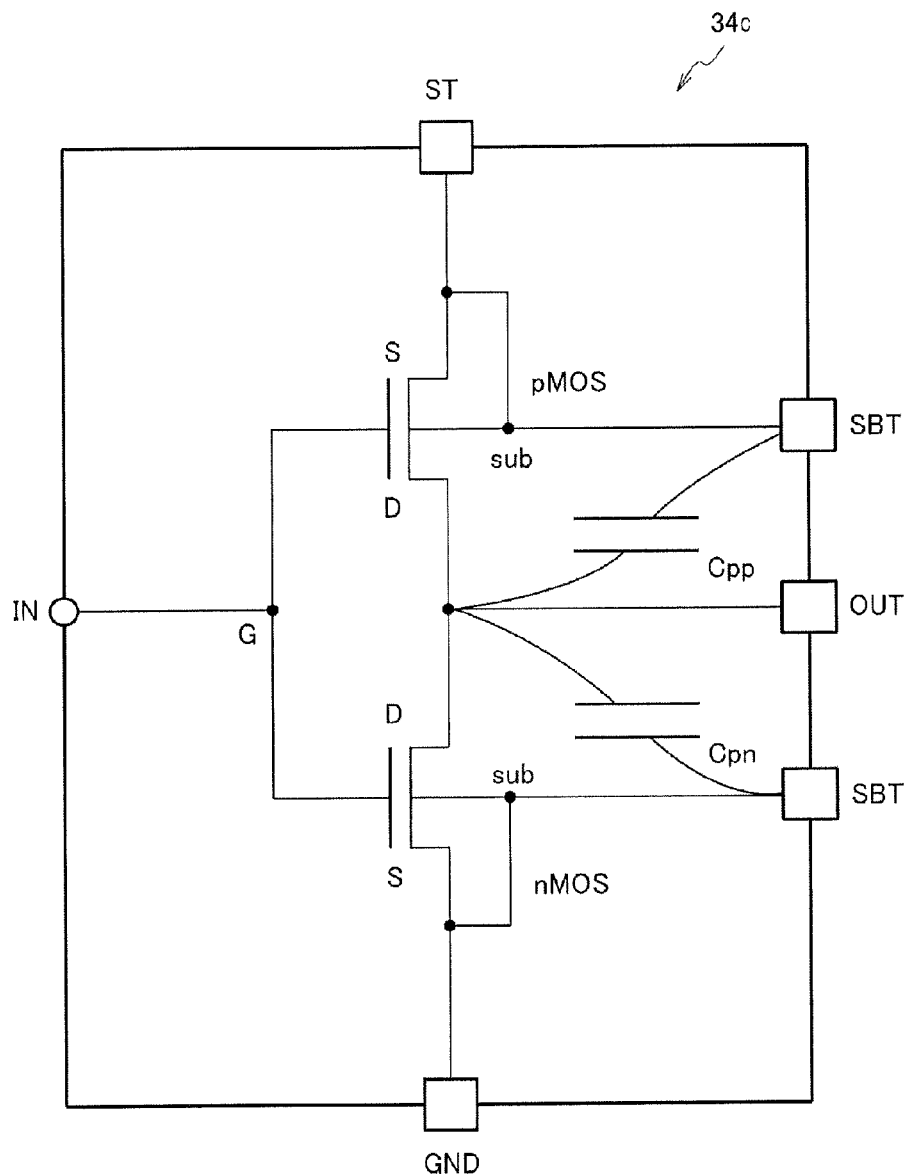
FIG. 10 is a view showing an example of a circuit diagram of a CMOSFET that can be utilized in a semiconductor integrated circuit device according to an embodiment.

FIG. 8 is a view showing an example of a circuit diagram of an n-channel MOSFET 34a that can be utilized in the semiconductor integrated circuit device 60 according to some embodiments. FIG. 9 is a view showing an example of a circuit diagram of a p-channel MOSFET 34b that can be utilized in the semiconductor integrated circuit device 60 according to some embodiments. FIG. 10 is a view showing an example of a circuit diagram of a CMOSFET 34c that can be utilized in the semiconductor integrated circuit device 60 according to some embodiments.

As shown in FIG. 8, a drain-substrate parasitic capacitance $C_{pn}$ is formed between a drain terminal electrode DT and a substrate terminal electrode SBT of the n-channel MOSFET (nMOSFET) 34a.

As shown in FIG. 9, a drain-substrate parasitic capacitance $C_{pp}$ is formed between a drain terminal electrode DT and a substrate terminal electrode SBT of the p-channel MOSFET (pMOSFET) 34b.

As shown in FIG. 10, drain-substrate parasitic capacitances $C_{pn}$ and $C_{pp}$ are respectively formed between a drain terminal electrode DT and substrate terminal electrodes SBT of the CMOSFET 34c.

Figure 11:
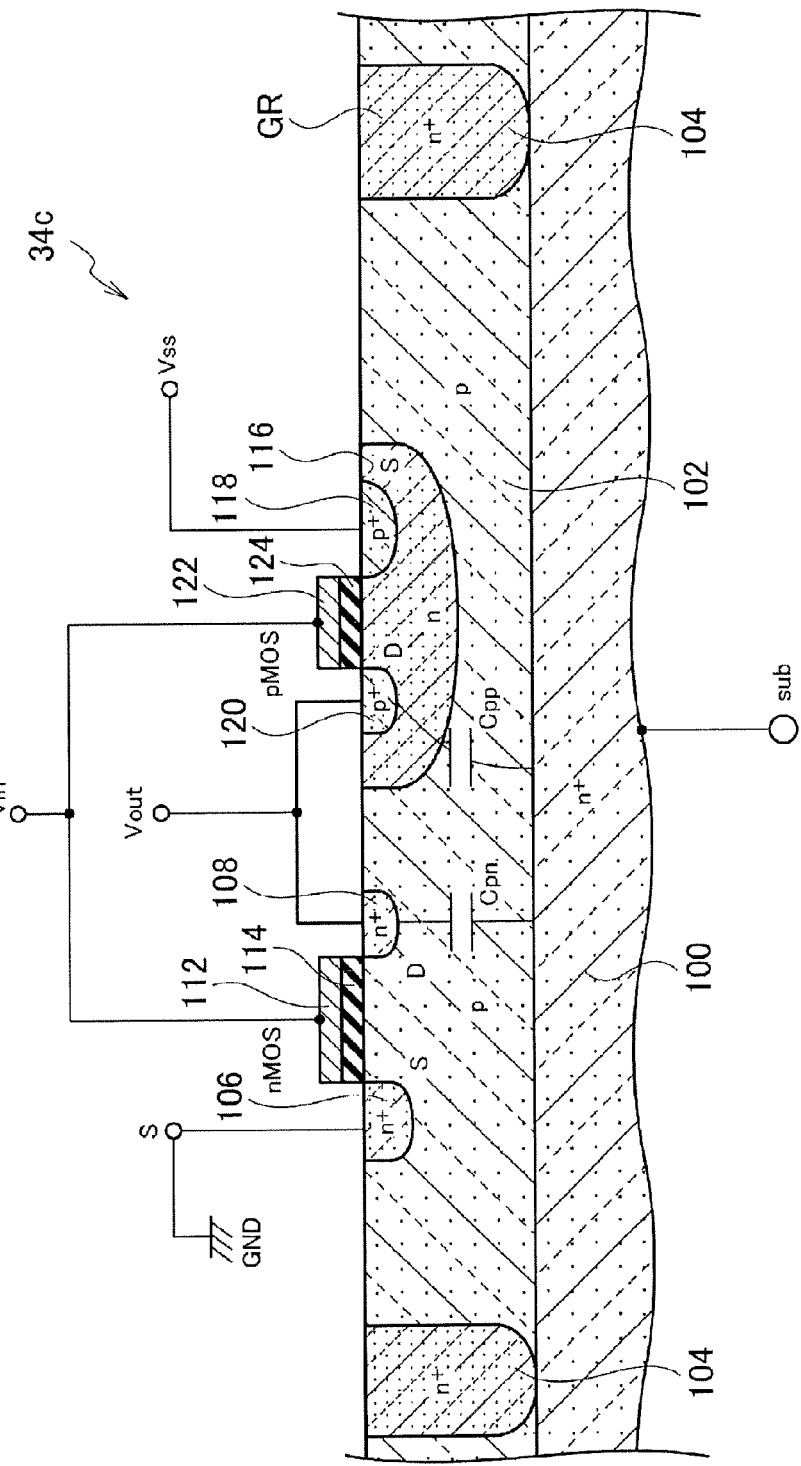
FIG. 11 is a schematic sectional view of a CMOSFET that can be utilized in a semiconductor integrated circuit device according to an embodiment.

FIG. 11 is a schematic sectional view of the CMOSFET 34c that can be utilized in the semiconductor integrated circuit device 60 according to the embodiment. As shown in FIG. 11, the CMOSFET 34c capable of being utilized in the semiconductor integrated circuit device 60 to drive the display apparatus 50 according to the embodiment includes a p-well region 102 formed on an n+ substrate 100 by p-well diffusion; an n-well region 116 formed in the p-well region 102 by n-well diffusion; a p+ source region 118 and a p+ drain region 120 formed in the n-well region 116 by p+ diffusion; an n+ source region 106 and an n+ drain region 108 formed in the p-well region 102 by n+ diffusion; a gate insulating film 114 formed on the p-well region 102 between the n+ source region 106 and the n+ drain region 108; a gate electrode 112 formed on the gate insulating film 114; a gate insulating film 124 formed on the n-well region 116 between the p+ source region 118 and the p+ drain region 120; and a gate electrode 122 formed on the gate insulating film 114 and connected in common to the gate electrode 112.

As shown in FIG. 11, the CMOSFET 34c further includes a guard ring region (GR) 104, which is formed in the p-well region 102 by n+ diffusion and surrounds the CMOSFET 34c.

The n+ source region 106, the n+ drain region 108/p+ drain region 120, the gate electrode 112/gate electrode 122 and the p+ source region 118 are connected to a source terminal S, an output terminal Vout, an input terminal Vin and a power supply terminal Vss, respectively. The n+ substrate 100 is connected to a substrate terminal sub. Since the n+ substrate 100 is connected to the guard ring region (GR) 104 formed by the n+ diffusion, the guard ring region (GR) 104 has the same potential as the n+ substrate 100. Thus, by forming an electrode for the guard ring region (GR) 104 from a device surface, the guard ring region (GR) 104 can have the same potential as the substrate terminal electrode SBT (see FIG. 10).

(Semiconductor Integrated Circuit Device)

Figure 12:
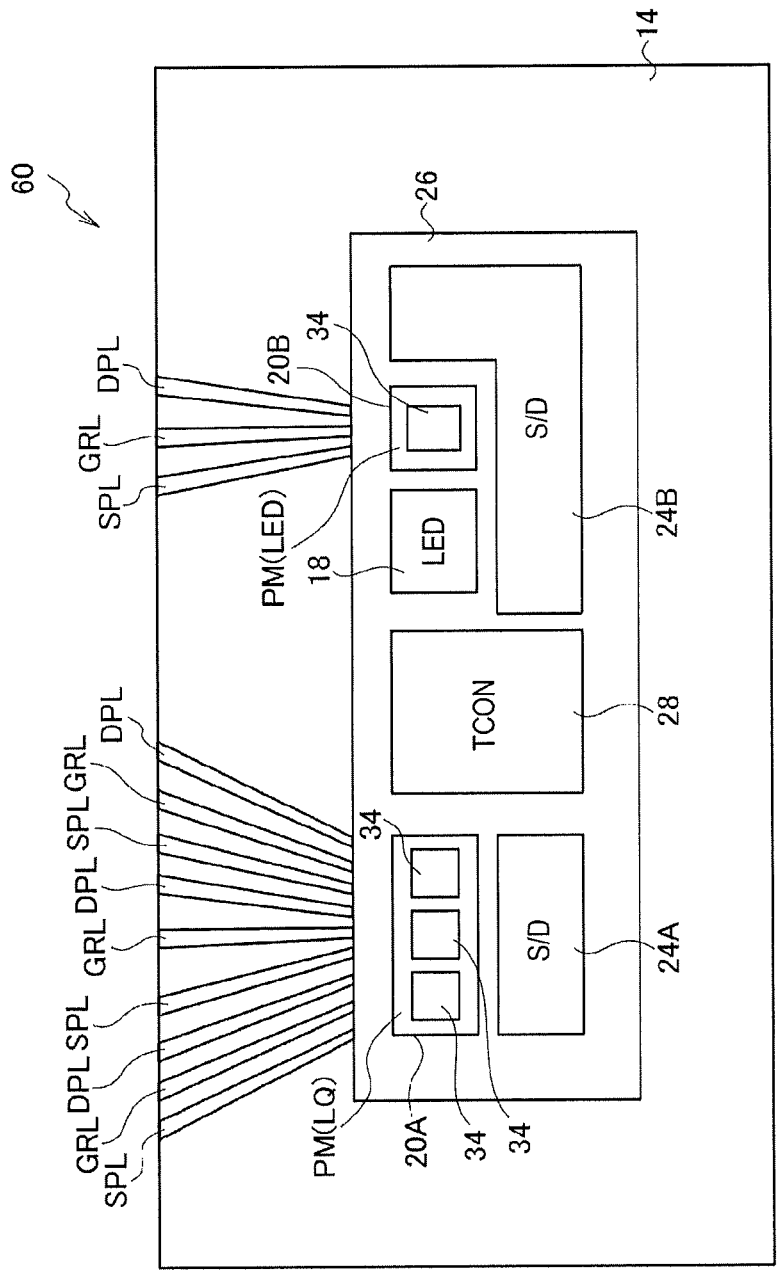
FIG. 12 is a schematic view of a planar pattern configuration where a semiconductor integrated circuit is mounted on a COF substrate in a semiconductor integrated circuit device according to an embodiment.

FIG. 12 is a schematic view of a planar pattern configuration where the semiconductor integrated circuit 26 is mounted on the COF substrate 14 in the semiconductor integrated circuit device 60 according to the embodiment.

Figure 13:
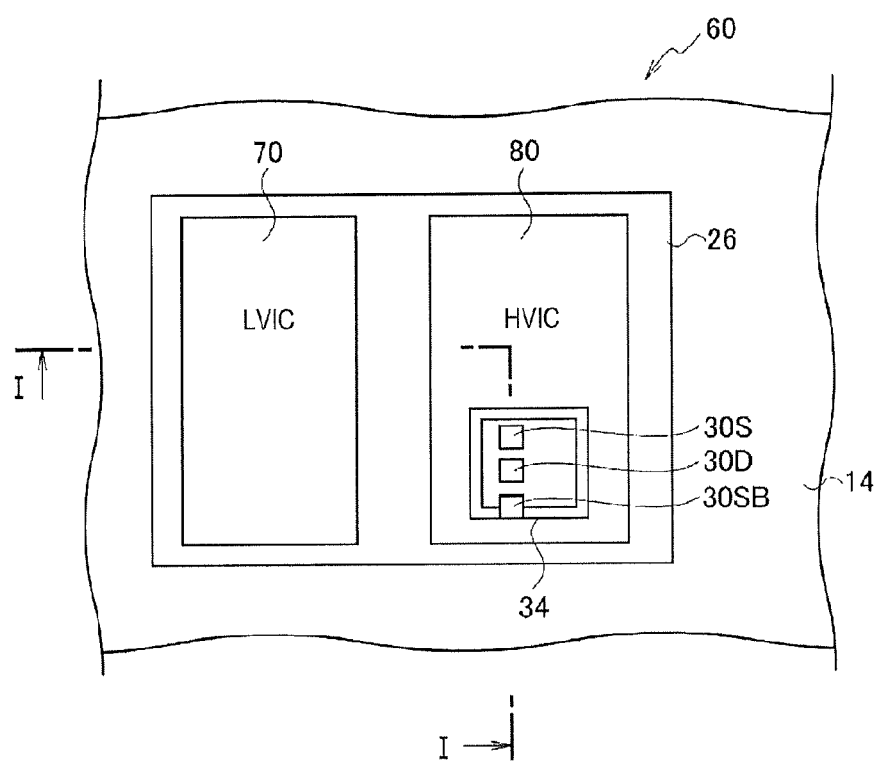
FIG. 13 is a schematic view of a planar pattern configuration where a high voltage circuit and a low voltage circuit are integrally mounted on a COF substrate in a semiconductor integrated circuit device according to an embodiment.
Figure 14:
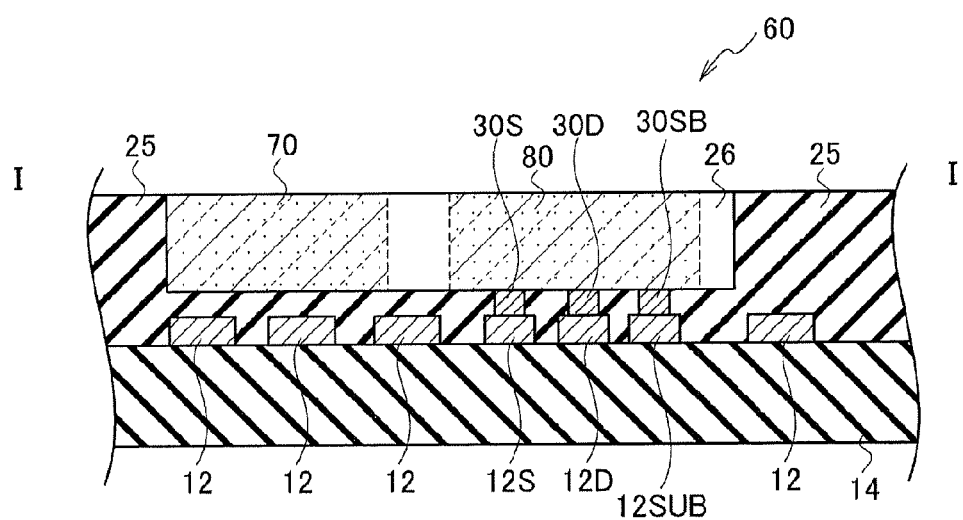
FIG. 14 is a schematic sectional view taken along line I-I of FIG. 13.

FIG. 13 is a schematic view of a planar pattern configuration where a high voltage circuit 80 and a low voltage circuit 70 are integrally mounted on the COF substrate 14 in the semiconductor integrated circuit device 60 according to the embodiment. FIG. 14 is a schematic sectional view taken along line I-I in FIG. 13.

In the semiconductor integrated circuit device 60 according to the embodiment, as shown in FIG. 12, source drivers 24A and 24B, a timing controller 28, an LED driver 18 and power management ICs 20A and 20B are mounted on the one-chip semiconductor integrated circuit 26.

Since power semiconductor devices acting as heat sources, for example, DMOSFETs 34, are mounted on the power management ICs 20A and 20B and the LED driver 18, a layout for dissipating heat generated therefrom using the COF wirings (source power line SPL, drain power line DPL and guard ring power line GRL) is made.

The DMOSFET 34 is used as, for example, a DC/DC converter, an LDO (Low Drop Out), a charge pump circuit, a switching regulator or the like. A current path causing heat generation in the DMOSFET 34 includes an ON current conduction path between the drain D and the source S of the DMOSFET 34 and a capacitive current conduction path via a parasite capacitance Cp between the drain D and a back gate (substrate sub) of the DMOSFET 34, as described above with reference to FIGS. 6 and 7.

That is, a current path causing heat generation is concentrated on three points, i.e., the drain terminal electrode DT, the source terminal electrode ST and the substrate terminal electrode SBT.

Accordingly, good heat dissipation can be achieved when a plurality of drain bumps 30D, source bumps 30S and guard ring bumps 30SB is intentionally arranged in an actual layout of the drain region 108, the source region 106 and the guard ring region 104 connected to the drain terminal electrode DT, the source terminal electrode ST and the substrate terminal electrode SBT, respectively.

That is, by arranging the plurality of drain bumps 30D, source bumps 30S and guard ring bumps 30SB as described above, heat can be dissipated in low thermal resistance (low thermal impedance) from the drain power line DPL, the source power line SPL and the guard ring power line GRL connected respectively to the drain bumps 30D, the source bumps 30S and the guard ring bumps 30SB.

The drain power line DPL, the source power line SPL and the guard ring power line GRL are formed by a COF wiring pattern (copper foil pattern 12) formed on the COF substrate 14 (see FIG. 14).

The drain power line DPL, the source power line SPL and the guard ring power line GRL are connected to a circuit constituted by at least an inductor, a diode, a capacitor, a resistor, an EEPROM and so on mounted on the PCB board 16 (see FIG. 1).

Thus, it is possible to realize a configuration of dissipating a large current and the associated heat to the PCB board 16 via the drain power line DPL, the source power line SPL and the guard ring power line GRL formed by the COF wiring pattern (see FIG. 12).

In addition, the drain bumps 30D, the source bumps 30S and the guard ring bumps 30SB are made of gold (Au) lower in thermal conductivity than copper (Cu) constituting the COF wiring pattern (Cu thermal conductivity: about 398 W/m·k, Au thermal conductivity: about 320 W/m·k).

Then, heat generated in the DMOSFET 34 can be conducted to the drain bumps 30D, the source bumps 30S and the guard ring bumps 30SB made of Au, then conducted to the COF wiring pattern (the drain power line DPL, the source power line SPL and the guard ring power line GRL) made of copper, which is higher in thermal conductivity than Au, and finally easily dissipated to the outside of the COF substrate 14 (for example, to the PCB board 16 shown in FIG. 1).

The semiconductor integrated circuit device 60 according to the embodiment includes the COF substrate 14, the semiconductor integrated circuit 26 mounted on the COF substrate 14 and including a low voltage circuit portion 70 operating at a low voltage (or low voltage range) and a high voltage circuit portion 80 operating at a high voltage (or high voltage range) higher than the low voltage, with the circuit portions 70 and 80 formed in a one-chip, and a resin layer 25 for sealing the COF substrate 14 and the semiconductor integrated circuit 26, as shown in FIGS. 13 and 14.

In the semiconductor integrated circuit device 60 according to the embodiment, the semiconductor integrated circuit 26 is placed on the COF substrate 14 in a flip-chip type, as shown in FIG. 14.

In addition, in the semiconductor integrated circuit device 60 according to the embodiment, the high voltage circuit portion 80 may include a power semiconductor device, for example, the DMOSFET 34, as shown in FIGS. 13 and 14.

Here, the micro bumps 30 serving as electrical connection and heat dissipation paths are arranged on corresponding terminal electrodes of the power semiconductor device (DMESFET) 34. Each terminal electrode of the power semiconductor device 34 includes the drain terminal electrode DT, the source terminal electrode ST and the substrate terminal electrode SBT.

Each micro bump 30 includes the drain bump 30D connected to the drain terminal electrode DT, the source bump 30S connected to the source terminal electrode ST, and the guard ring bump 30SB connected to the substrate terminal electrode SBT.

In addition, the semiconductor integrated circuit device 60 according to the embodiment includes COF wirings 12 (12S, 12D and 12SUB) arranged on the COF substrate 14, as shown in FIGS. 13 and 14, and the drain power line DPL, the source power line SPL and the guard ring power line GRL are formed by the COF wirings 12S, 12D and 12SUB, respectively.

The COF wirings 12 (12S, 12D and 12SUB) are formed by a conductive pattern arranged on the COF substrate 14. This conductive pattern is formed by, for example, a copper foil pattern.

Figure 15:
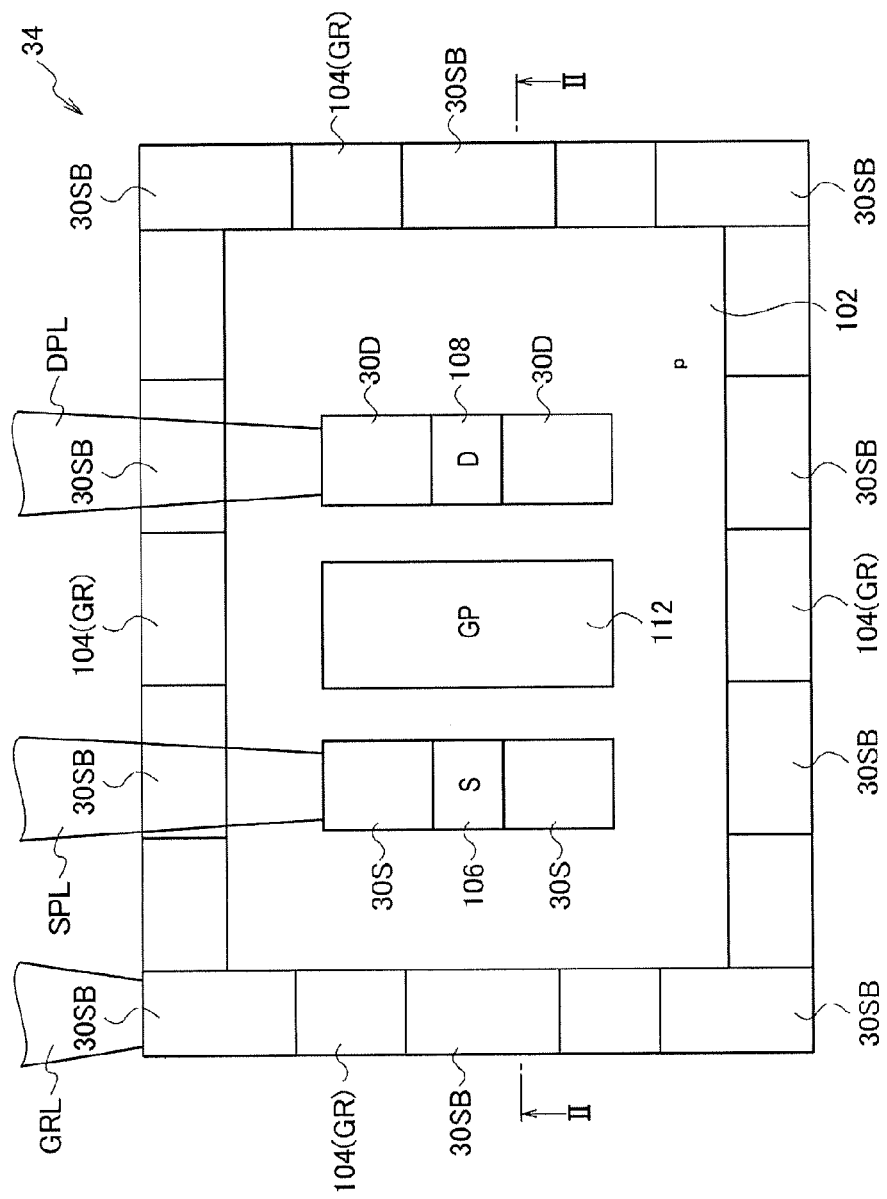
FIG. 15 is a schematic view of a planar pattern configuration including peripheral guard rings GR of a DMOSFET in a high voltage circuit portion arranged on a COF substrate in a semiconductor integrated circuit device according to an embodiment, where a source bump, a drain bump and a guard ring bump are arranged on a source region, a drain region and a guard ring region, respectively.

FIG. 15 is a schematic view of a planar pattern configuration including peripheral guard rings GR of the DMOSFET 34 in the high voltage circuit portion (HVIC) 80 arranged on the COF substrate 14 in the semiconductor integrated circuit device 60 according to the embodiment. As shown in FIG. 15, a source bump 30S, a drain bump 30D and a guard ring bump 30SB are arranged on a source region (S) 106, a drain region (D) 108 and a guard ring region (GR) 104, respectively. FIG. 16 is a schematic sectional view taken along line II-II in FIG. 15.

As shown in FIGS. 15 and 16, the DMOSFET 34 capable of being utilized in the semiconductor integrated circuit device 60 according to the embodiment includes a p-well region 102 formed on an n+ substrate 100 by p-well diffusion, a p-type base region 110 formed in the p-well region 102 by p-type diffusion; an n+ source region 106 formed on the p-type base region 110 by n+ diffusion; an n+ drain region 108 formed in the p-well region 102 by n+ diffusion; a gate insulating film 114 formed on the p-well region 102 between the n+ source region 106 and the n+ drain region 108; and a gate electrode 112 formed on the gate insulating film 114.

As shown in FIG. 11, the DMOSFET 34 further includes a guard ring region (GR) 104, which is formed in the p-well region 102 by n+ diffusion and surrounds the DMOSFET 34. In addition, as shown in FIG. 16, surfaces of the p-well region 102 and so on are covered by an interlayer insulating film 44.

That is, as shown in FIGS. 15 and 16, the DMOSFET 34 includes the guard ring region 104 surrounding the periphery of the DMOSFET 34 and connected to the substrate terminal electrodes SBT, and the guard ring bump 30SB is disposed on the guard ring region 104.

In addition, as shown in FIGS. 15 and 16, the DMOSFET 34 includes the source bump 30S and the drain bump 30D disposed on the n+ source region 106 and the n+ drain region 108, respectively.

In addition, as shown in FIGS. 15 and 16, the DMOSFET 34 includes the drain power line DPL connected to the drain bump 30D, the source power line SPL connected to the source bump 30S, and the guard ring power line GRL connected to the guard ring bump 30SB.

Although the power semiconductor device is shown as the DMOSFET 34 in FIG. 15, the power semiconductor device may be implemented with one of a MOS transistor, a DMOS transistor and a CMOS transistor.

As shown in FIG. 15, the source power line SPL, the drain power line DPL and the guard ring power line GRL are connected to the source region 106, the drain region 108 and the guard ring region 104 via the source bump 30S, the drain bump 30D and the guard ring bump 30SB, respectively.

In addition, as shown in FIG. 15, the source power line SPL, the drain power line DPL and the guard ring power line GRL extend outwardly beyond the guard ring region (GR) 104 of the DMOSFET 34 and serve as electrical connections and heat dissipation paths.

In addition, the source power line SPL, the drain power line DPL and the guard ring power line GRL may be configured to be widened as they move away from the drain bump 30D, the source bump 30S and the guard ring bump 30SB, respectively. That is, the drain power line DPL, the source power line SPL and the guard ring power line GRL may be formed in, for example, a fan shape, a drumstick shape, a reverse trapezoidal shape, or an inversely tapered shape. By forming these power lines in such a shape, a large current and corresponding heat can be efficiently conducted.

In addition, the thermal conductivity of materials of the drain power line DPL, the source power line SPL and the guard ring power line GRL may be higher than that of materials of the drain bump 30D, the source bump 30S and the guard ring bump 30SB. The reason for this is to conduct heat effectively from the drain bump 30D, the source bump 30S and the guard ring bump 30SB to the drain power line DPL, the source power line SPL and the guard ring power line GRL.

For example, the drain power line DPL, the source power line SPL and the guard ring power line GRL may be made of copper (Cu) and the drain bump 30D, the source bump 30S and the guard ring bump 30SB may be made of gold (Au).

In addition, a plurality of (two in the example of FIG. 15) source bumps 30S and drain bumps 30D may be arranged in the source region 106 and the drain region 108, respectively. In addition, a plurality of guard ring bumps 30SB may be arranged in the guard ring region 104.

In addition, the micro bumps (BMP) 30 (30S, 30D and 30SB) may be formed by means of lithography or the like using a photo mask or the like.

In the semiconductor integrated circuit device 60 according to the embodiment, heat generated between the drain region (D) 108 and the source region (S) 106 of the DMOSFET 34 in the high voltage circuit portion (HVIC) 80 arranged on the COF substrate 14 is conducted from the drain bump 30D and the source bump 30S to the drain power line DPL and the source power line SPL formed by COF wiring, respectively. That is, when the drain bump 30D and the source bump 30S are made of gold (Au) and the drain power line DPL and the source power line SPL are made of copper (Cu), efficient thermal conduction is made from the drain bump 30D and the source bump 30S having a higher thermal conductivity to the drain power line DPL and the source power line SPL having a lower thermal conductivity. Here, since the thermal conductivity of Au is, for example, about 320 W/m·K and the thermal conductivity of Cu is, for example, about 398 W/m·K, efficient thermal conduction is made from the drain bump 30D and the source bump 30S made of Au to the drain power line DPL and the source power line SPL made of Cu.

In the semiconductor integrated circuit device 60 according to the embodiment, some of the heat generated between the drain region (D) 108 and the source region (S) 106 of the DMOSFET 34 in the high voltage circuit portion (HVIC) 80 arranged on the COF substrate 14 may be conducted inside the high voltage circuit portion (HVIC) 80. However, by disposing the guard ring bump 30SB on the peripheral guard ring region (GR) 104 of the DMOSFET 34, heat can be dissipated in low thermal impedance from the guard ring power line GRL connected to the guard ring bump 30SB. Since thermal conductivity of silicon (Si) is about 40% of that of Cu, for example, about 168 W/m·K, the heat being conducted inside the high voltage circuit portion (HVIC) 80 can be dissipated by the low thermal impedance from the guard ring power line GRL connected to the guard ring bump 30SB.

In the semiconductor integrated circuit device 60 according to the embodiment, since the heat generated between the drain region (D) 108 and the source region (S) 106 can be efficiently dissipated from the drain bump 30D, the source bump 30S and the guard ring bump 30SB to the outside via the drain power line DPL, the source power line SPL and the guard ring power line GRL, respectively, and thermal conduction to other portions of the semiconductor integrated circuit 26 can be substantially reduced, the temperature of the semiconductor integrated circuit device 60 can be prevented from increasing.

Although it has been illustrated in the above that the DMOSFET 34 is employed as a power semiconductor device that can be utilized in the semiconductor integrated circuit device 60 to drive the display apparatus 50 according to the embodiment, the power semiconductor device is not limited to the DMOSFET 34 but may be an n-channel MOSFET, a p-channel MOSFET or a CMOSFET.

In addition, an example of high voltage integrated circuit mounted on the high voltage circuit portion (HVIC) 80 may include a power management IC, an LED driver and the like. An example of the power management IC may include a DC/DC converter, an LDO (Low Drop Out), a charge pump circuit or the like.

Figure 17A:
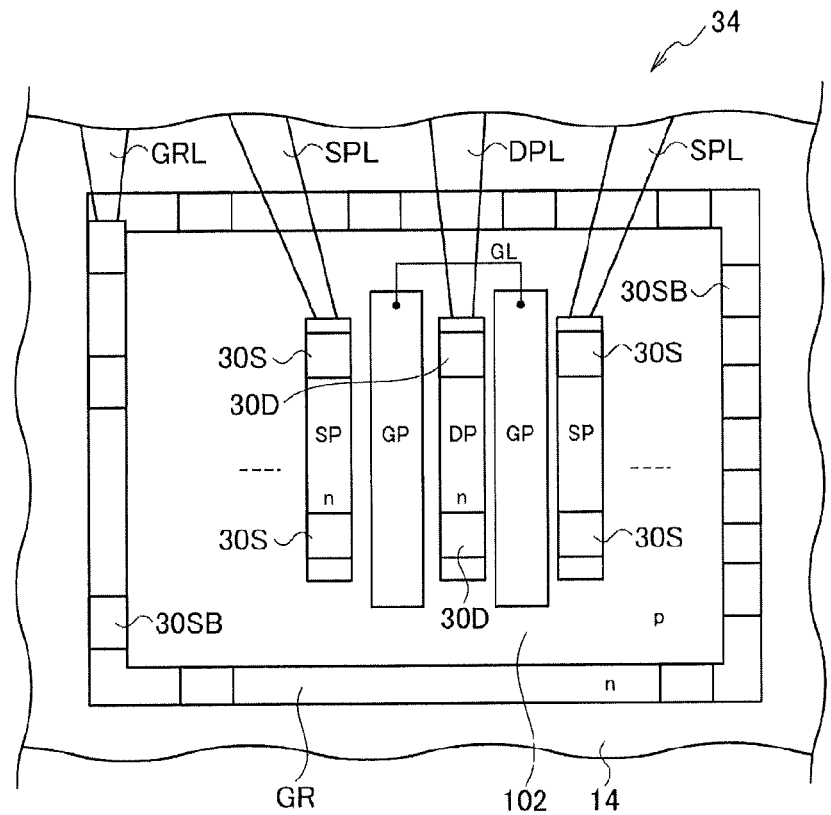
FIG. 17A is another schematic view of a planar pattern configuration including peripheral guard rings GR of a DMOSFET in a high voltage circuit portion arranged on a COF substrate in a semiconductor integrated circuit device according to an embodiment.
Figure 17B:
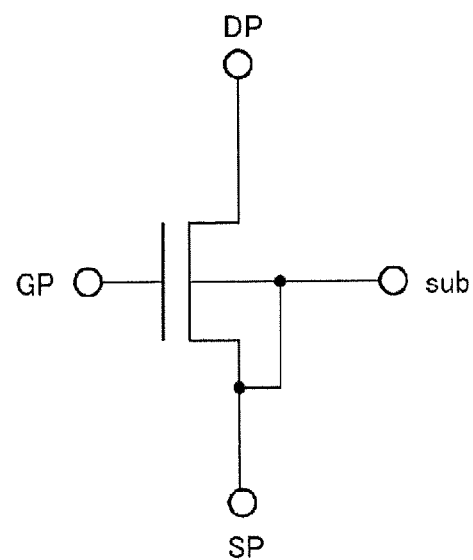
FIG. 17B is a representation of circuit elements of the DMOSFET corresponding to FIG. 17A.

FIG. 17A is another schematic view of a planar pattern configuration including peripheral guard rings GR of the DMOSFET 34 in the high voltage circuit portion (HVIC) 80 arranged on the COF substrate 14 in the semiconductor integrated circuit device 60 according to an embodiment. In the example of FIG. 17A, a source bump electrode SP, a gate bump electrode GP and a drain bump electrode DP are repeatedly arranged to form one DMOSFET 34. FIG. 17B is a representation of circuit elements of the DMOSFET 34 corresponding to FIG. 17A.

As shown in FIG. 17A, the source power line SPL, the drain power line DPL and the guard ring power line GRL are connected to the source bump electrode SP, the drain bump electrode DP and the guard ring GR, respectively.

In addition, the source power line SPL, the drain power line DPL and the guard ring power line GRL becomes widened as they move away from their respective connection terminals. This allows a large current and corresponding heat to be efficiently conducted.

In addition, a plurality of (two in the example of FIG. 17A) micro bumps (BMP) 30S and 30D may be arranged in the source bump electrode SP and the drain bump electrode DP, respectively. In addition, a plurality of micro bumps (BMP) 30SB may be arranged in the guard ring GR.

Figure 18:
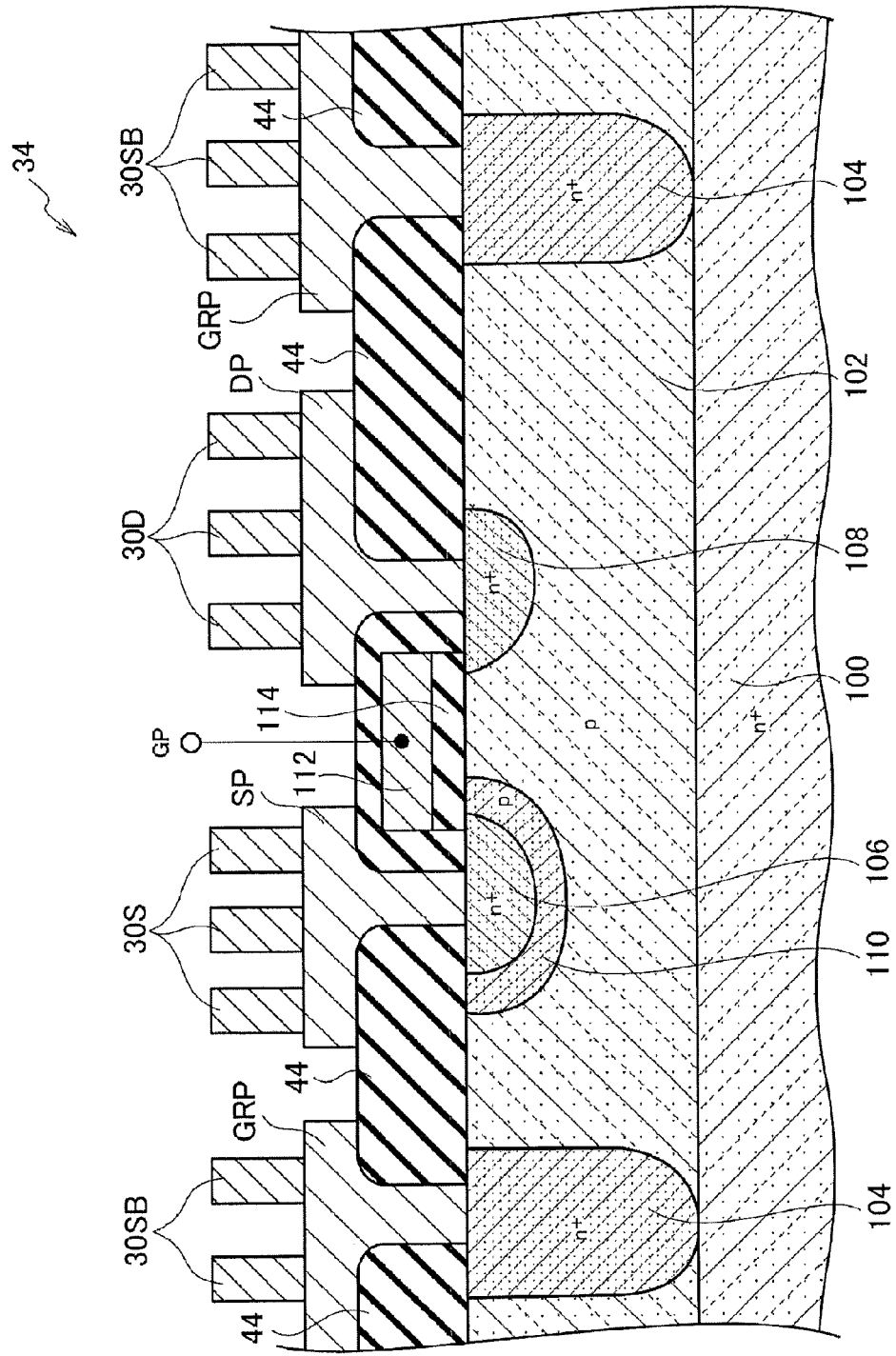
FIG. 18 is a schematic view showing a sectional structure including peripheral guard rings GR of a DMOSFET in a high voltage circuit portion arranged on a COF substrate in a semiconductor integrated circuit device according to an embodiment.

FIG. 18 is a schematic view showing a sectional structure including peripheral guard rings GR of the DMOSFET 34 in the high voltage circuit portion (HVIC) 80 arranged on the COF substrate 14 in the semiconductor integrated circuit device 60 according to an embodiment. FIG. 18 shows an example of arrangement of the source bump 30S, the drain bump 30D and the guard ring bump 30SB on the source bump electrode SP, the drain bump electrode DP and the guard ring bump electrode GRP, respectively. As shown in FIG. 18, a plurality of source bumps 30S, drain bumps 30D and guard ring bumps 30SB may be arranged on the source bump electrode SP, the drain bump electrode DP and the guard ring bump electrode GRP, respectively. In addition, as shown in FIG. 18, surfaces of the p-well region 102 and so on are covered by an interlayer insulating film 44.

Figure 19:
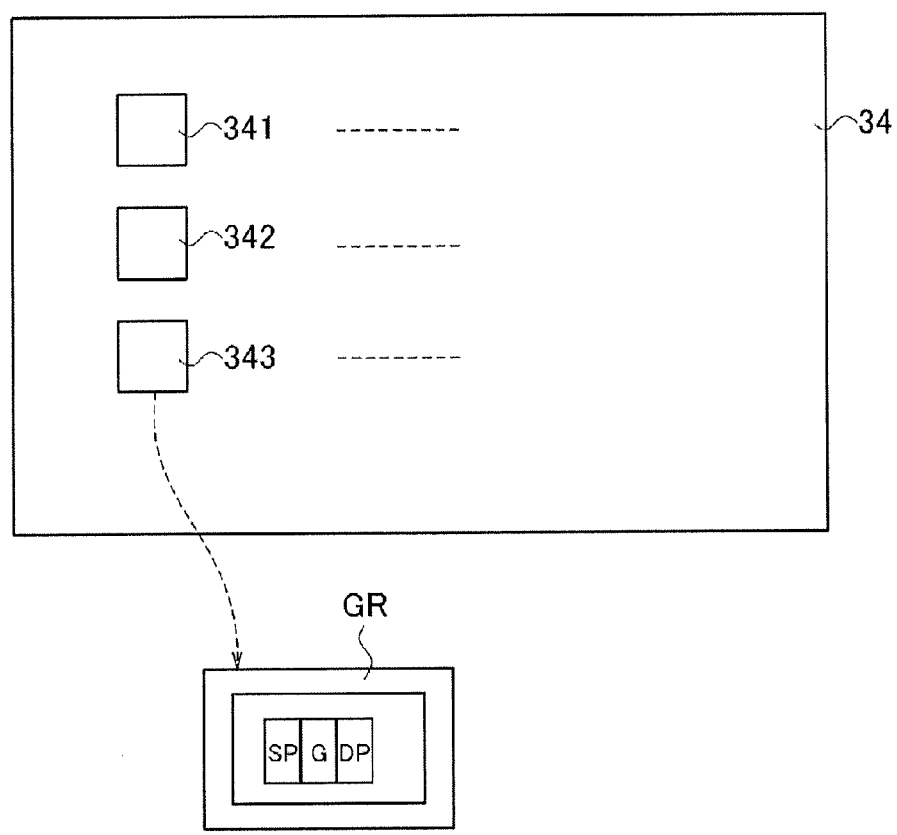
FIG. 19 is a schematic view showing a planar pattern configuration of a DMOSFET including arranging a plurality of guard ring-attached DMOSFET units in a semiconductor integrated circuit device according to an embodiment.

FIG. 19 is a schematic view showing a planar pattern of the DMOSFET 34 constituted by arranging a plurality of guard ring-attached DMOSFET units 341, 342 and 343 in the semiconductor integrated circuit device 60 according to the embodiment. In the semiconductor integrated circuit device 60 according to the embodiment, as shown in FIG. 19, the DMOSFET 34 of the high voltage circuit portion (HVIC) 80 may be constituted by arranging and connecting a plurality of guard ring-attached DMOSFET units 341, 342, 343 . . . in parallel.

Figure 20A:
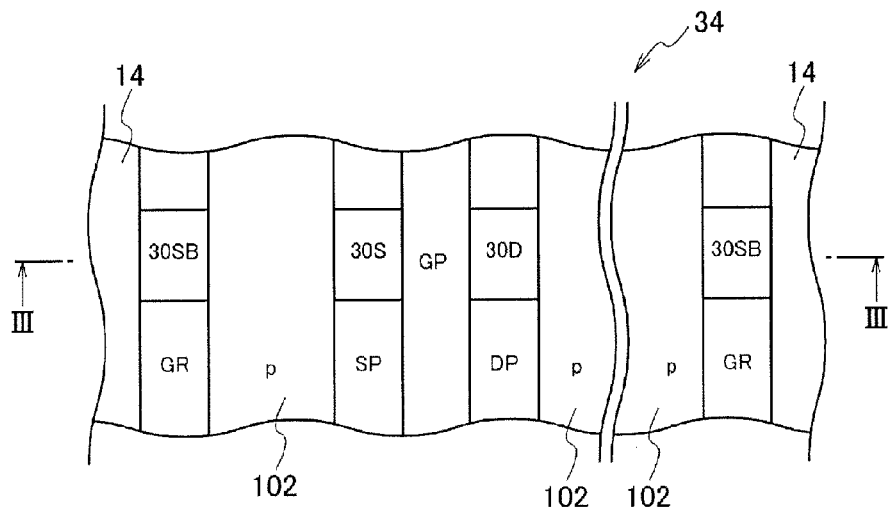
FIG. 20A is another schematic view of a planar pattern configuration of a guard ring-attached DMOSFET in a semiconductor integrated circuit device according to an embodiment.
Figure 20B:
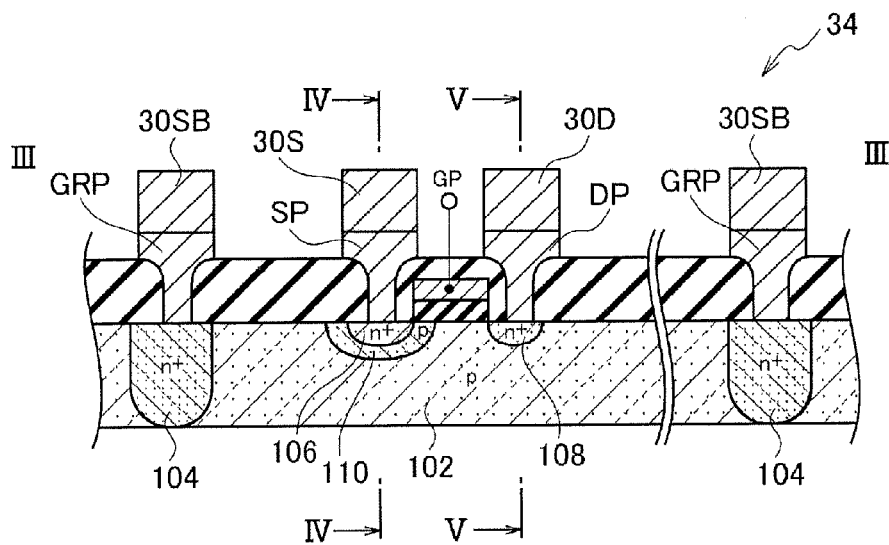
FIG. 20B is a schematic sectional view taken along line in FIG. 20A.
Figure 21A:
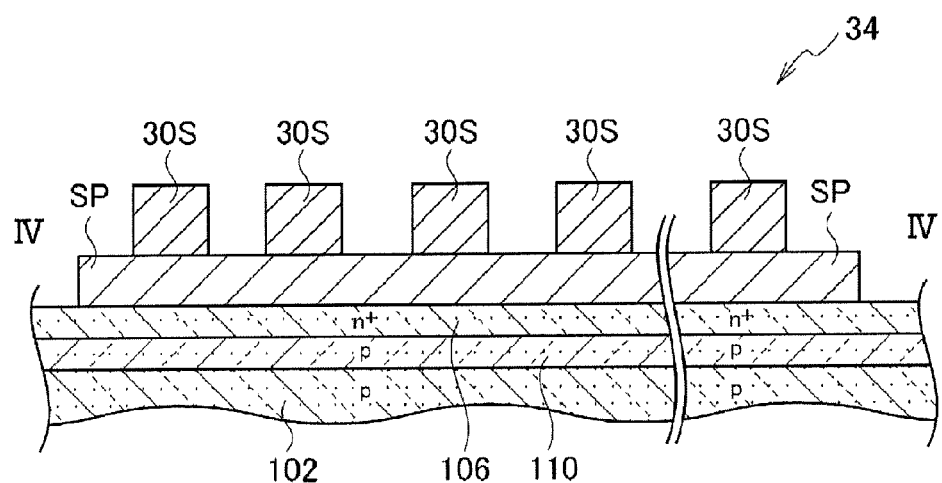
FIG. 21A is a schematic sectional view taken along line IV-IV in FIG. 20B.
Figure 21B:
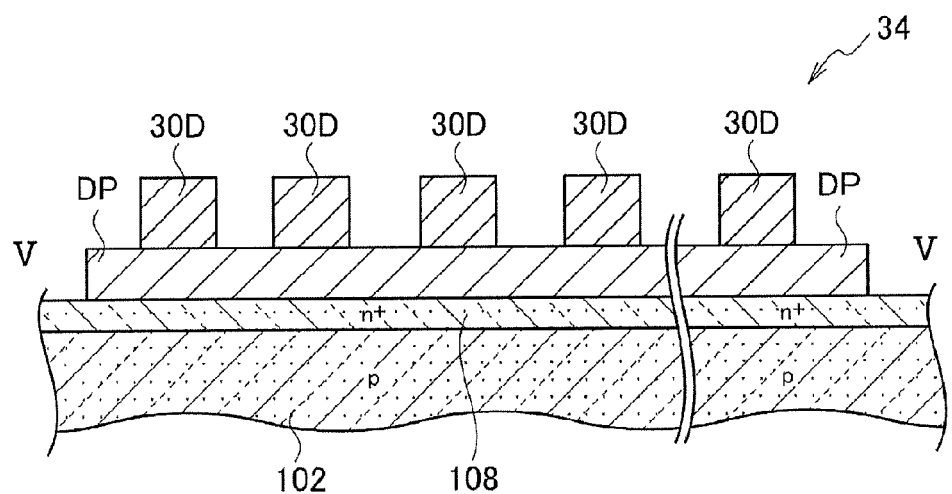
FIG. 21B is a schematic sectional view taken along line V-V in FIG. 20B.

FIG. 20A is another schematic view of a planar pattern configuration of a guard ring-attached DMOSFET 34 in the semiconductor integrated circuit device 60 according to an embodiment. FIG. 20B is a schematic sectional view taken along line in FIG. 20A. FIG. 21A is a schematic sectional view taken along line IV-IV in FIG. 20B. FIG. 21B is a schematic sectional view taken along line V-V in FIG. 20B.

As shown in FIGS. 20A and 20B, the guard ring-attached DMOSFET 34, which can be utilized in the semiconductor integrated circuit device 60 according to the embodiment includes a guard ring bump 30SB disposed on a guard ring bump electrode GRP, a source bump 30S disposed on a source bump electrode SP, and a drain bump 30D disposed on a drain bump electrode DP. In addition, as shown in FIGS. 21A and 21B, a plurality of source bumps 30S is arranged on the source bump electrode SP and a plurality of drain bumps 30D is arranged on the drain bump electrode DP.

Figure 22A:
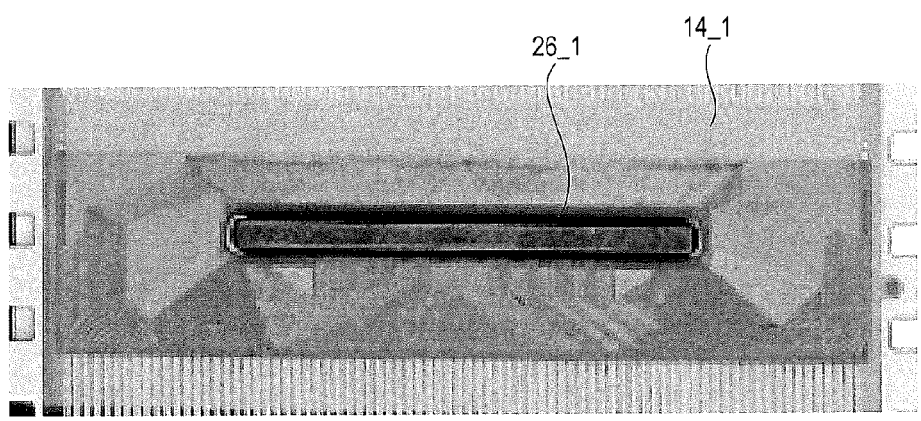
FIG. 22A is a surface photographic example of a semiconductor integrated circuit (slave chip) mounted on a COF substrate in a semiconductor integrated circuit device according to an embodiment.
Figure 22B:
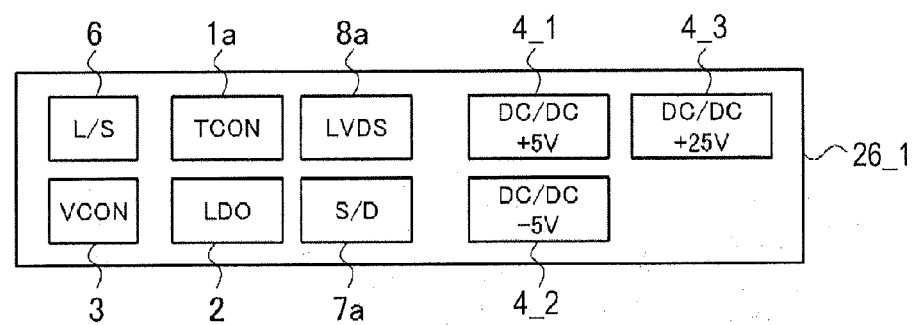
FIG. 22B is a schematic planar block diagram of the semiconductor integrated circuit (slave chip) of FIG. 22A.

FIG. 22A shows a surface photographic example in which a semiconductor integrated circuit (slave chip) 26_1 is mounted on a COF substrate 14_1 in the semiconductor integrated circuit device 60 according to an embodiment. FIG. 22B is a schematic planar block diagram of the semiconductor integrated circuit (slave chip) 26_1 of FIG. 22A.

In the semiconductor integrated circuit device 60, as shown in FIG. 22A, the semiconductor integrated circuit 26_1 is mounted on the film-like COF substrate 14_1. The dimension of the COF substrate 14_1 shown in FIG. 22A is about 1.3 mm×23.0 mm. Since this film-like COF substrate 14_1 is flexible, it can be folded and disposed on the back side of the display unit 10 (see FIG. 1).

As shown in FIG. 22B, the semiconductor integrated circuit (slave chip) 26_1 is mounted therein, for example, with a level shifter (L/S) 6, a timing controller (TCON) 1a, a low voltage driving signaling (LVDS) 8a, DC/DC converters 4_1, 4_2 and 4_3, a voltage control IC (VCON) 3, an LDO regulator 2 and a source driver (S/D) 7a. The DC/DC converters 4_1 and 4_2 are for +5V and −5V and may be used as upper and lower power supplies for the source driver (S/D) 7a, respectively. The DC/DC converter 43 is for +25V and may be used as an upper power supply for a gate driver.

Figure 23A:
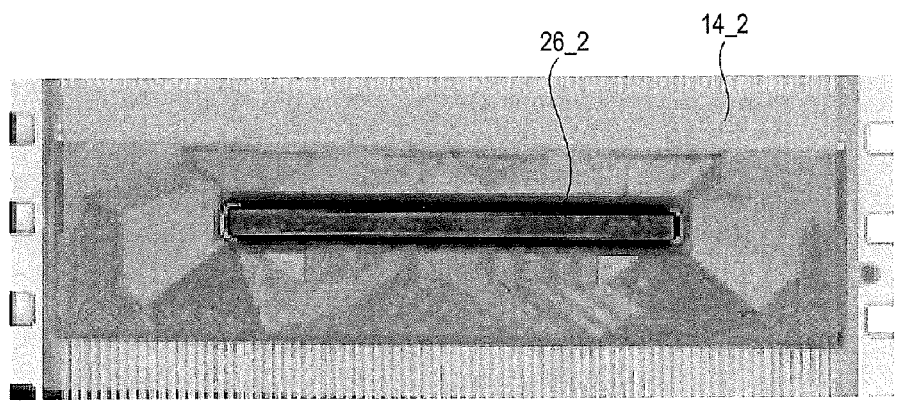
FIG. 23A is a surface photographic example of a semiconductor integrated circuit (master chip) mounted on a COF substrate in a semiconductor integrated circuit device according to an embodiment.
Figure 23B:
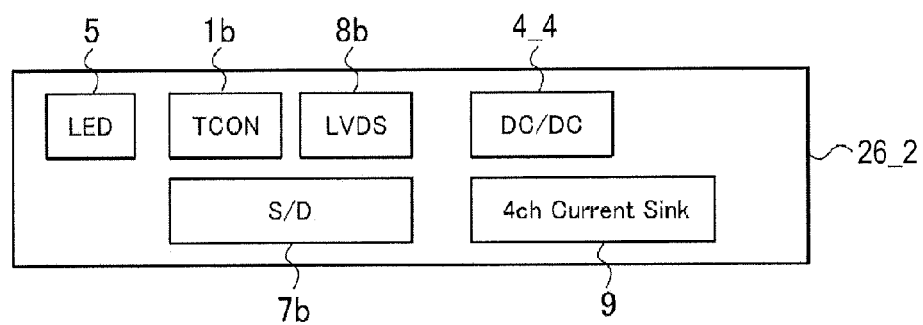
FIG. 23B is a schematic planar block diagram of the semiconductor integrated circuit of FIG. 23A.

FIG. 23A shows a surface photographic example in which a semiconductor integrated circuit (master chip) 26_2 is mounted on a COF substrate 14_2 in the semiconductor integrated circuit device 60 according to an embodiment. FIG. 23B is a schematic planar block diagram of the semiconductor integrated circuit (master chip) 26_2 of FIG. 23A.

As shown in FIG. 23B, the semiconductor integrated circuit (master chip) 26_2 is mounted therein, for example, with an LED driver 5, a timing controller (TCON) 1b, a low voltage driving signaling (LVDS) 8b, a DC/DC converter 4_4, a source driver (S/D) 7b and a 4ch current sink 9.

The temperature of the semiconductor integrated circuit (slave chip) 26_1 obtained in the semiconductor integrated circuit device 60 according to the embodiment is increased to about 50 degrees C. in operation and the temperature of the semiconductor integrated circuit (master chip) 26_2 obtained in the semiconductor integrated circuit device 60 according to the embodiment may be increased to about 52 degrees C. in operation.

Accordingly, a COF-structured semiconductor integrated circuit device 60 can be provided, since heat can be efficiently dissipated from a high voltage circuit portion.

Figure 24:
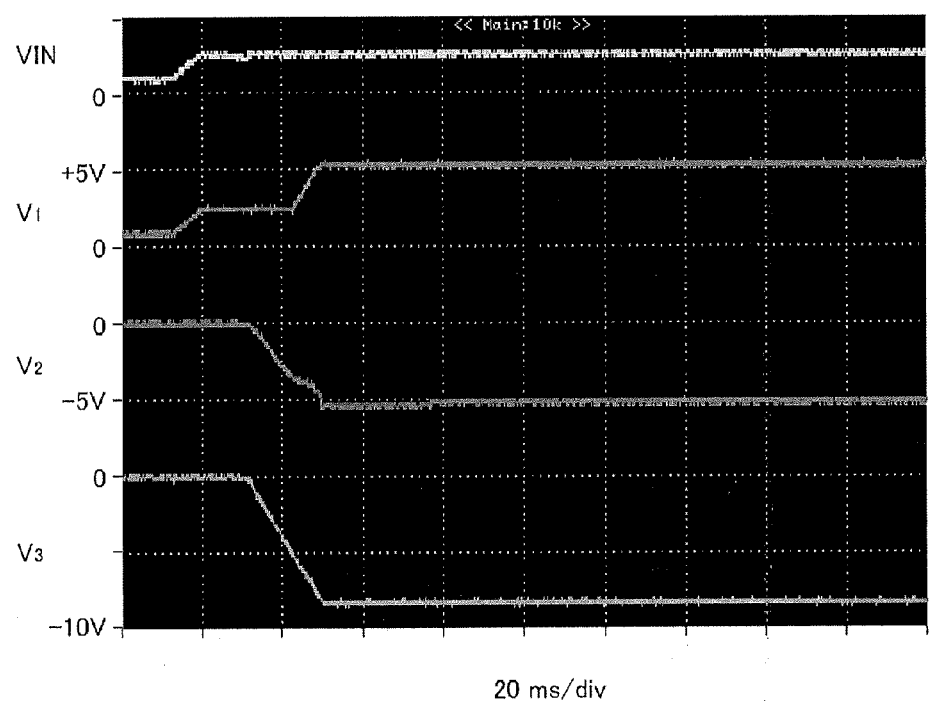
FIG. 24 is waveform examples of an operation of a semiconductor integrated circuit device according to an embodiment.

FIG. 24 shows waveform examples of the operation of the semiconductor integrated circuit device 60 according to the embodiment. In FIG. 24, VIN, $V_1$, $V_2$ and $V_3$ represent an input voltage waveform, a waveform at +5V, a waveform at −5V and a waveform at −10V, respectively.

Figure 25:
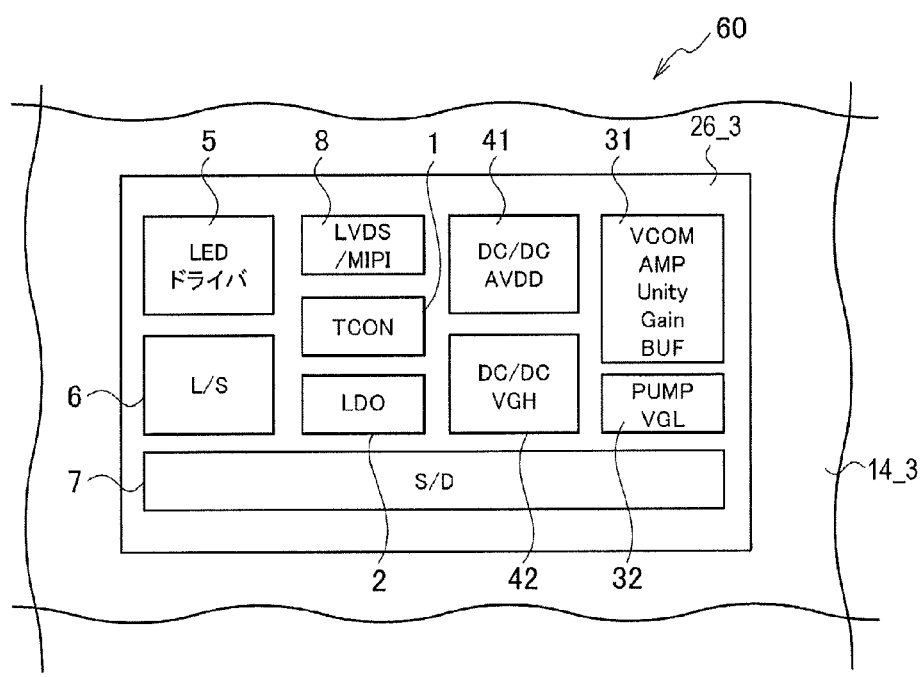
FIG. 25 is a schematic planar block diagram of another semiconductor integrated circuit mounted on a COF substrate of a semiconductor integrated circuit device according to an embodiment.

FIG. 25 is a schematic planar block diagram of another semiconductor integrated circuit 26_3 mounted on a COF substrate 14_3 in the semiconductor integrated circuit device 60 according to the embodiment.

In the example shown in FIG. 25, the semiconductor integrated circuit 26_3 includes an LED driver 5, a low voltage driving signaling (LVDS) 8, a level shifter (L/S) 6, a timing controller (TCON) 1, an LDO regulator 2, DC/DC converters 41 and 42, a voltage comparator (VCOM) 31, a charge pump (PUMP) 32 and a source driver (S/D) 7.

The DC/DC converter 41 set at +10V may be used as an upper power supply (AVDD) for the source driver. The DC/DC converter 42 set at +25V may be used as an upper power supply (VGH) for a gate driver. The charge pump (PUMP) 32 may be used as a lower power supply (VGL) for the gate driver.

The configuration of the semiconductor integrated circuit 26_1 mounted on the COF substrate 14_1 shown in FIG. 22A, the configuration of the semiconductor integrated circuit 26_2 mounted on the COF substrate 14_2 shown in FIG. 23A, and the configuration of the semiconductor integrated circuit 26_3 mounted on the COF substrate 14_3 shown in FIG. 25 are not limited thereto but may be suitably changed depending on configuration and usage of the display unit 10.

(LED Array)

Figure 26:
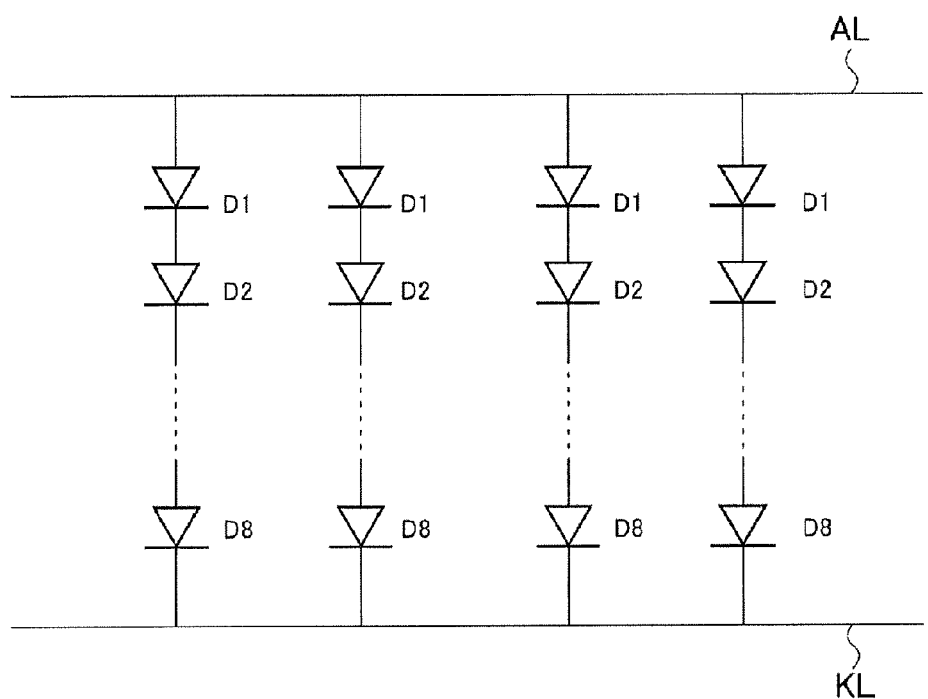
FIG. 26 is a circuit diagram showing an array of 4ch×8 serial LEDs driven by an LED driver in a semiconductor integrated circuit device according to an embodiment.

FIG. 26 is a circuit diagram example of an array of 4ch×8 serial LED. The 4ch×8 serial LED array circuit of FIG. 26 can be driven by the LED driver 5 of the display apparatus 50 according to the embodiment. In the example of FIG. 26, a 4ch LED array, each channel having 8 LEDs D1, D2, . . . , D8 connected in series, is connected between an anode line AL and a cathode line KL. The LED array may be driven by the LED driver 5 having the ability to supply a driving voltage of, for example, about 30V to 40V and acts as a backlight for the display apparatus 50 according to the embodiment.

(TFT Array Disposed on Display Unit)

Figure 27A:
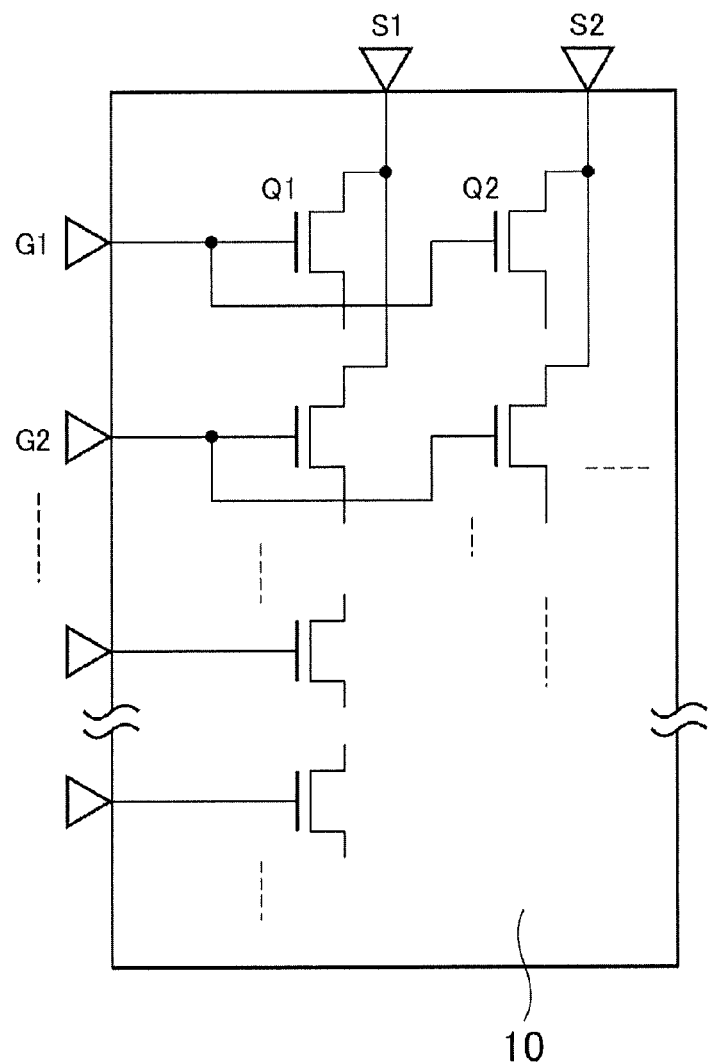
FIG. 27A is a circuit diagram showing an example of a TFT array cell portion disposed on a display unit in a display apparatus according to an embodiment.
Figure 27B:
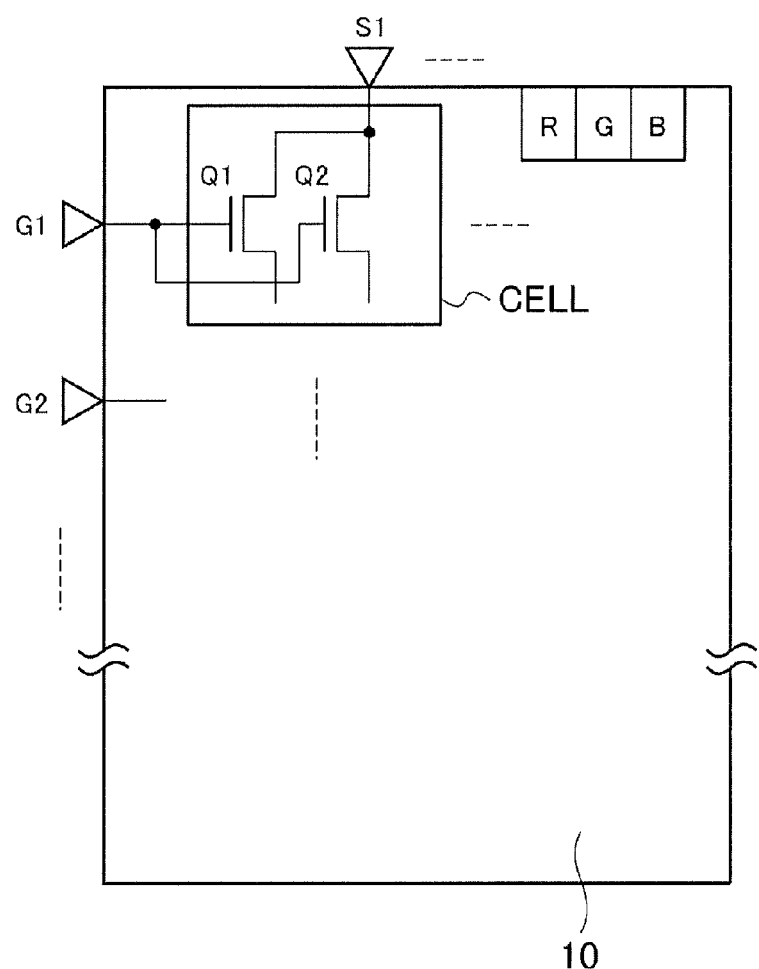
FIG. 27B is a circuit diagram showing an example of another TFT array cell portion disposed on a display unit in a semiconductor integrated circuit device and a display apparatus according to an embodiment.

FIG. 27A is a circuit diagram example of a TFT array cell portion disposed on the display unit 10 in the display apparatus 50 according to the embodiment. FIG. 27B is a circuit diagram example of another TFT array cell portion disposed on the display unit 10 in the display apparatus 50 according to the embodiment.

As shown in FIG. 27A, the TFT array cell portion includes transistors Q1, Q2, . . . which are respectively connected to source lines S1, S2, and gate lines G1, G2, . . . .

The source lines S1, S2, . . . , and the gate lines G1, G2, . . . , of the transistors Q1, Q2, . . . , are driven by a source driver (S/D) and a gate driver to select each transistor.

In the example of FIG. 28B, two transistors Q1 and Q2 arranged in one cell CELL, and the source lines S1, S2, . . . , and the gate lines G1, G2, . . . , of each cell are driven by the respective source drivers (S/D) and gate drivers. Each cell may be an element of an RGB array. In case of forming the display unit 10 with a high resolution, for example, the number of source lines S1, S2, . . . , is 1366RGB×(½)×(½)=1206, the number of gate lines G1, G2, . . . , is 768, and 1366RGB× 768 TFTs can be arranged in the display unit 10.

(Electronic Apparatus)

The semiconductor integrated circuit device 60 according to the various embodiments can be applied to a variety of electronic apparatuses. That is, the semiconductor integrated circuit device 60 according to the embodiment can be used to provide a variety of electronic apparatuses. For example, the semiconductor integrated circuit device 60 according to the embodiment may be incorporated in electronic apparatuses such as, mobile phones, digital cameras, video cameras, tablet terminals, desktop computers, printers, TV sets, notebook computers, electronic toys, various display apparatuses, and the like.

Although in various embodiments described above the power semiconductor device has been illustrated to include a MOSFET that can be easily integrated, the present disclosure may be applied to other power devices such as, for example, insulated gate bipolar transistors (IGBTs), thyristors, triacs, SiC-based power devices, GaN-based power devices, heterojunction bipolar transistors, SiGe-based devices and the like.

Other Embodiments

As described above, the present disclosure has been illustrated by way of various embodiments, but the description and drawings which constitute a part of this disclosure are exemplary and should not be construed to limit the present disclosure. Various alternative embodiments, examples and operation techniques will be apparent to those skilled in the art from this disclosure.

Thus, the present disclosure may encompass various embodiments which are not described herein.

Since the semiconductor integrated circuit device of various embodiments of the present disclosure can mount a single chip semiconductor integrated circuit having a high voltage circuit portion and a low voltage circuit portion in a COF package, it can be applied to various electronic apparatuses such as liquid crystal display apparatuses, backlight control apparatuses, and in other fields such as flexible electronics, transparent electronics and so on.

A COF-structured semiconductor integrated circuit device, and an electronic apparatus using the same, may include low and high voltage circuit portions formed on a single chip, which is capable of improving mounting efficiency and dissipating heat from the high voltage circuit portion efficiently.

While certain embodiments have been described, these embodiments have been presented by way of example only, and are not intended to limit the scope of this disclosure. Indeed, novel methods and apparatuses described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit device comprising:
   a COF (Chip On Film) substrate;
   a semiconductor integrated circuit mounted on the COF substrate and including a first voltage circuit portion operating at a first voltage range and a second voltage circuit portion operating at a second voltage range higher than the first voltage range, the circuit portions being formed on a single chip, the second voltage circuit portion including a power semiconductor device,
   wherein the power semiconductor device includes:
      a plurality of terminal electrodes including a drain terminal electrode, a source terminal electrode, and a back gate terminal electrode and further including bumps configured as electrical connections and heat dissipation paths, wherein the bumps include a drain bump connected to the drain terminal electrode, a source bump connected to the source terminal electrode, and a guard ring bump connected to the back gate terminal electrode; and
      a guard ring region surrounding the periphery of the power semiconductor device and being connected to the back gate terminal electrode, wherein the guard ring bump is disposed in the guard ring region; and
   a resin layer for sealing the COF substrate and the semiconductor integrated circuit.

2. The semiconductor integrated circuit device of claim 1, further comprising:
   a drain power line connected to the drain bump;
   a source power line connected to the source bump; and
   a guard ring power line connected to the guard ring bump.

3. The semiconductor integrated circuit device of claim 2, further comprising a COF wiring disposed on the COF substrate,
   wherein the drain power line, the source power line and the guard ring power line are formed by the COF wiring.

4. The semiconductor integrated circuit device of claim 3, wherein the COF wiring is formed by a conductive pattern disposed on the COF substrate.

5. The semiconductor integrated circuit device of claim 2, wherein the drain power line, the source power line and the guard ring power line are widened as the drain power line, the source power line and the guard ring power line move away from the drain bump, the source bump and the guard ring bump, respectively.

6. The semiconductor integrated circuit device of claim 2, wherein the drain power line, the source power line and the guard ring power line extend outwardly beyond the guard ring region of the power semiconductor device and are configured as electrical connections and heat dissipation paths.

7. The semiconductor integrated circuit device of claim 2, wherein a thermal conductivity of material of the drain power line, the source power line and the guard ring power line is higher than a thermal conductivity of material of the drain bump, the source bump and the guard ring bump.

8. The semiconductor integrated circuit device of claim 7, wherein the material of the drain power line, the source power line and the guard ring power line is copper and the material of the drain bump, the source bump and the guard ring bump is gold.

9. A display apparatus comprising:
   a semiconductor integrated circuit device comprising:
      a COF (Chip On Film) substrate;
      a semiconductor integrated circuit mounted on the COF substrate and including a first voltage circuit portion operating at a first voltage range and a second voltage circuit portion operating at a second voltage range higher than the first voltage range, the circuit portions being formed on a single chip; and
      a resin layer for sealing the COF substrate and the semiconductor integrated circuit;
   a display unit connected to the semiconductor integrated circuit device; and
   a PCB (Printed Circuit Board) arranged adjacent to the COF substrate and mounted thereon with discrete components connected to the semiconductor integrated circuit device.

10. The display apparatus of claim 9, wherein the discrete components include an inductor, a capacitor and a diode.

* * * * *